United States Patent
Bhalla et al.

(10) Patent No.: US 10,446,695 B2
(45) Date of Patent: Oct. 15, 2019

(54) PLANAR MULTI-IMPLANTED JFET

(71) Applicant: United Silicon Carbide, Inc., Monmouth Junction, NJ (US)

(72) Inventors: Anup Bhalla, Princeton Junction, NJ (US); Zhongda Li, Somerset, NJ (US)

(73) Assignee: United Silicone Carbide, Inc., Monmouth Junction, NJ (US)

( * ) Notice: Subject to any disclaimer, the term of this patent is extended or adjusted under 35 U.S.C. 154(b) by 168 days.

(21) Appl. No.: 15/482,139

(22) Filed: Apr. 7, 2017

(65) Prior Publication Data

US 2017/0213917 A1    Jul. 27, 2017

Related U.S. Application Data

(63) Continuation-in-part of application No. 14/918,774, filed on Oct. 21, 2015, now Pat. No. 9,653,618.

(51) Int. Cl.
  *H01L 29/16* (2006.01)
  *H01L 29/10* (2006.01)
  (Continued)

(52) U.S. Cl.
  CPC ...... *H01L 29/8083* (2013.01); *H01L 21/0465* (2013.01); *H01L 29/0843* (2013.01);
  (Continued)

(58) Field of Classification Search
  CPC ............ H01L 21/0465; H01L 29/0619; H01L 29/0692; H01L 29/0843; H01L 29/1058;
  (Continued)

(56) References Cited

U.S. PATENT DOCUMENTS 5,120,669 A * 6/1992 Schrantz .......... H01L 29/66901
                                                148/DIG. 106
6,303,947 B1    10/2001 Ueno et al.
(Continued)

FOREIGN PATENT DOCUMENTS

| EP | 1542270 A1 | 6/2005 |
| JP | 2000252475 A | 9/2000 |
| JP | 2004-335697 A | 11/2004 |

OTHER PUBLICATIONS

International Search Report and The Written Opinion of the International Searching Authority dated Jan. 30, 2017, 14 pages.

*Primary Examiner* — Duy T Nguyen
(74) *Attorney, Agent, or Firm* — BakerHostetler

(57) ABSTRACT

A JFET having vertical and horizontal channel elements may be made from a semiconductor material such as silicon carbide using a first mask for multiple implantations to form a horizontal planar JFET region comprising a lower gate, a horizontal channel, and an upper gate, all above a drift region resting on a drain substrate region, such that the gates and horizontal channel are self-aligned with the same outer size and outer shape in plan view. A second mask may be used to create a vertical channel region abutting the horizontal channel region. The horizontal channel and vertical channel may each have multiple layers with varying doping concentrations. Angled implantations may use through the first mask to implant portions of the vertical channel regions. The window of the second mask may partially overlap the horizontal JFET region to insure abutment of the vertical and horizontal channel regions.

10 Claims, 29 Drawing Sheets

(51) Int. Cl.
*H01L 29/66* (2006.01)
*H01L 29/06* (2006.01)
*H01L 29/808* (2006.01)
*H01L 29/08* (2006.01)
*H01L 29/423* (2006.01)
*H01L 21/04* (2006.01)
*H01L 29/20* (2006.01)
*H01L 29/36* (2006.01)

(52) U.S. Cl.
CPC ...... *H01L 29/1058* (2013.01); *H01L 29/1066* (2013.01); *H01L 29/1095* (2013.01); *H01L 29/1608* (2013.01); *H01L 29/2003* (2013.01); *H01L 29/42316* (2013.01); *H01L 29/66068* (2013.01); *H01L 29/66909* (2013.01); *H01L 29/0619* (2013.01); *H01L 29/0692* (2013.01); *H01L 29/36* (2013.01)

(58) Field of Classification Search
CPC ............. H01L 29/1066; H01L 29/1095; H01L 29/1608; H01L 29/2003; H01L 29/36; H01L 29/42316; H01L 29/66068; H01L 29/66909; H01L 29/8083
See application file for complete search history.

(56) References Cited

U.S. PATENT DOCUMENTS

| | | | |
|---|---|---|---|
| 6,841,812 | B2 | 1/2005 | Zhao |
| 8,169,007 | B2 | 5/2012 | Anderson et al. |
| 8,981,445 | B2 | 3/2015 | Mitchell et al. |
| 2003/0089930 | A1* | 5/2003 | Zhao ................ H01L 29/42316 257/256 |
| 2005/0173726 | A1 | 8/2005 | Potts |
| 2005/0230715 | A1* | 10/2005 | Hoshino ............. H01L 29/0634 257/263 |
| 2008/0191277 | A1* | 8/2008 | Disney ............... H01L 29/0638 257/343 |
| 2011/0284930 | A1 | 11/2011 | Hershberger et al. |
| 2012/0168820 | A1* | 7/2012 | Liu ........................ H01L 29/16 257/192 |
| 2012/0187483 | A1 | 7/2012 | Yang et al. |
| 2013/0221418 | A1 | 8/2013 | Mitchell et al. |
| 2013/0248945 | A1* | 9/2013 | Bracale ............. H01L 27/088 257/262 |
| 2014/0346528 | A1 | 11/2014 | Hisada et al. |
| 2014/0346628 | A1 | 11/2014 | Hisada et al. |
| 2015/0179688 | A1 | 6/2015 | Shinoharo et al. |
| 2017/0117418 | A1 | 4/2017 | Bhalla et al. |
| 2017/0213917 | A1 | 7/2017 | Bhalla et al. |

* cited by examiner

PLANAR MULTI-IMPLANTED JFET

CROSS REFERENCE TO RELATED APPLICATIONS

This application is a continuation-in-part of U.S. patent application Ser. No. 14/918,774, filed on Oct. 21, 2015 entitled "Planar triple-implanted JFET," now U.S. Pat. No. 9,653,618, granted May 16, 2017, the content of which is hereby incorporated by reference in its entirety. This application is related to U.S. patent application Ser. No. 15/267,177 filed Sep. 16, 2016 entitled "Planar triple-implanted JFET," now U.S. Pat. No. 10,121,907, granted Nov. 6, 2018.

FIELD OF THE DISCLOSURE

Vertical junction field-effect transistors made from wide bandgap materials such as silicon carbide are useful in power electronic circuits, such as power factor correction (PFC) circuits, DC-DC converters, DC-AC inverters, and motor drives.

SUMMARY

Junction field-effect transistors (JFETs) and methods of constructing JFETs are described herein. A JFET having vertical and horizontal channel elements may be made from a semiconductor material such as silicon carbide (SiC) by a method using a single mask for multiple implantations to form a horizontal planar JFET region comprising a lower gate, a horizontal channel, and an upper gate, all above a drift region resting on a drain substrate region, such that the gates and channel are self-aligned. Additional implantations may be made through the same mask to vary the doping levels within the channel, for example. Additional angle implantations may be made through the same mask to implant vertical channel regions abutting the horizontal gate and channel regions. The threshold of the device may be tightly controlled by doping concentration of the horizontal channel, where the doping concentration of the vertical channel is selected to avoid affecting overall device operation. A source region may be formed through a portion of the top gate, and the top and bottom gates are connected. The top gate may abut the source region, or alternatively be separated from the source by, e.g., a ring, of light doped material. A vertical channel region may be formed adjacent to the planar JFET region and extending through the top gate, horizontal channel, and bottom gate to connect to the drift, such that the lower gate modulates the vertical channel as well as the horizontal channel, and current from the sources flows first through the horizontal channel and then through the vertical channel into the drift region.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying figures. The figures are not necessarily drawn to scale.

FIG. 10 is a vertical cross section of a starting substrate comprising a lower drain region and upper drift region.

FIG. 11 is a vertical cross section of the substrate with triple implant, shown with an implant mask in place.

FIG. 12 is a vertical cross section showing the addition of vertical channel implant, shown with the vertical channel implant mask in place.

FIG. 13 is a vertical cross section showing the addition of a source implant, shown with the source implant mask in place.

FIG. 14 is a perspective view of the active cell of an example multi-implanted JFET in process, showing the surface contact region for the lower gate connection.

FIGS. 15 and 16 are further perspective views of an example cell in process.

FIGS. 17 and 18 are vertical cross sections of an example cell in process

DETAILED DESCRIPTION OF ILLUSTRATIVE EMBODIMENTS

Junction field-effect transistors and methods of constructing JFETs are described herein. A JFET having vertical and horizontal planar elements may be made from a high bandgap semiconductor material such as silicon carbide (SiC) by a method using multiple implantations on a substrate comprising an upper drift region and a lower drain region. The multiple implantations are used to form a horizontal planar JFET region comprising a lower gate, a horizontal channel, and an upper gate, all above a drift region resting on a drain substrate region. A source region may be formed through a portion of the top gate, and the top and bottom gates are connected. A vertical channel region is formed adjacent to the planar JFET region and extending through the top gate, horizontal channel, and bottom gate to connect to the drift, such that the lower gate modulates the vertical channel as well as the horizontal channel, and current from the sources flows first through the horizontal channel and then through the vertical channel into the drift.

Herein, the terms "vertical implant," "vertical implantation" and the like refer to implanting that is done generally perpendicular to the substrate, and may include the use of multiple beams, multiple energies, and multiple angles.

When making transistors in a wide-bandgap semiconductor material such as SiC, GaN, AlN, or diamond, JFET-type structures are often preferred over MOS-type structures. This is due to the difficulty of obtaining the same quality of oxide interface as seen with Si/SiO2. This in turn makes it difficult to achieve transistors with the same level of reliability in MOS surface conduction channels, which are prone to degradation. JFETs avoid this issue because JFETs are bulk devices, unlike MOS devices, and do not require surface conduction channels. This is particularly advantageous for high power devices, since surface conduction channel reliability issues are exacerbated at higher operating temperatures.

Figure 1:
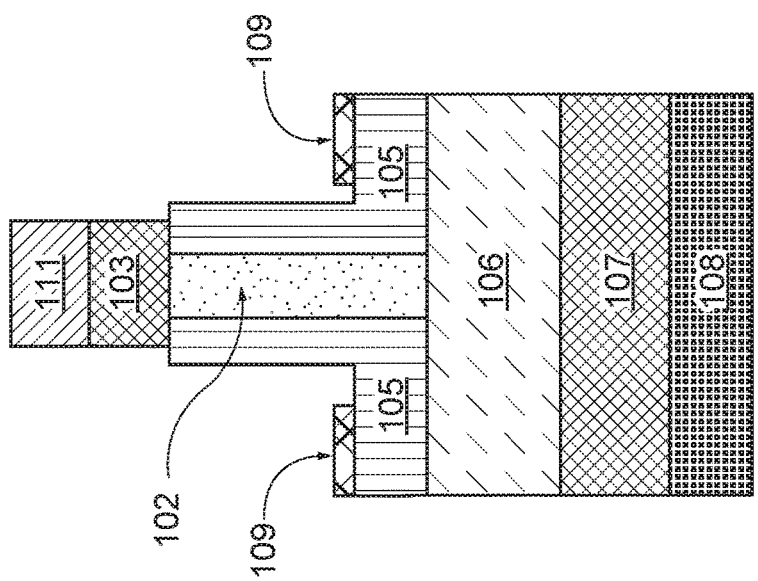
FIG. 1 provides, for reference, a cross section of an active cell of a prior art vertical JFET.

FIG. 1 shows a vertical cross section of the active cell of a prior art vertical trench JFET. The channel 102 and the gate regions 105 form a mesa, with the channel 102 at the center of the mesa. Atop the mesa, the upper source region 103 is in contact with the channel 102. The source contact 111 connects to the source 103. The gate regions 105 are connected to the gate contacts 109. At the bottom of the mesa, the channel 102 connects to the drift region 106. The drift region 106 serves as a voltage blocking layer. The drift region may be grown epitaxially on the substrate drain region 107, for example. The drain 107 is connected to the drain contact 108. The channel 102 may be formed, for example, through epitaxial growth or by implanting at an angle between the gate regions 105 through either or both sides of the mesa.

Precise control of the threshold voltage (Vth) in such a trench vertical JFET may be challenging since Vth varies with the amount and the position of charge in the channel 102. These may be strongly affected by process variations. For example, the mesa width may fluctuate due to variations in the photo process, the etch process, and the etch slope. This may lead to large variations in Vth. These variations may be reduced to some extent by forming the channel 102 by implantation. However, some variation in mesa dimensions and sidewall angles will persist. For example, in order to maintain good blocking capability in the off-state, especially for normally-off devices and normally-on devices with very negative Vth voltages, the vertical structure requires the use of very long channel regions 102. This in turn adds the complexity of deep trench etches, which are quite difficult to control in wide bandgap materials.

Figure 2:
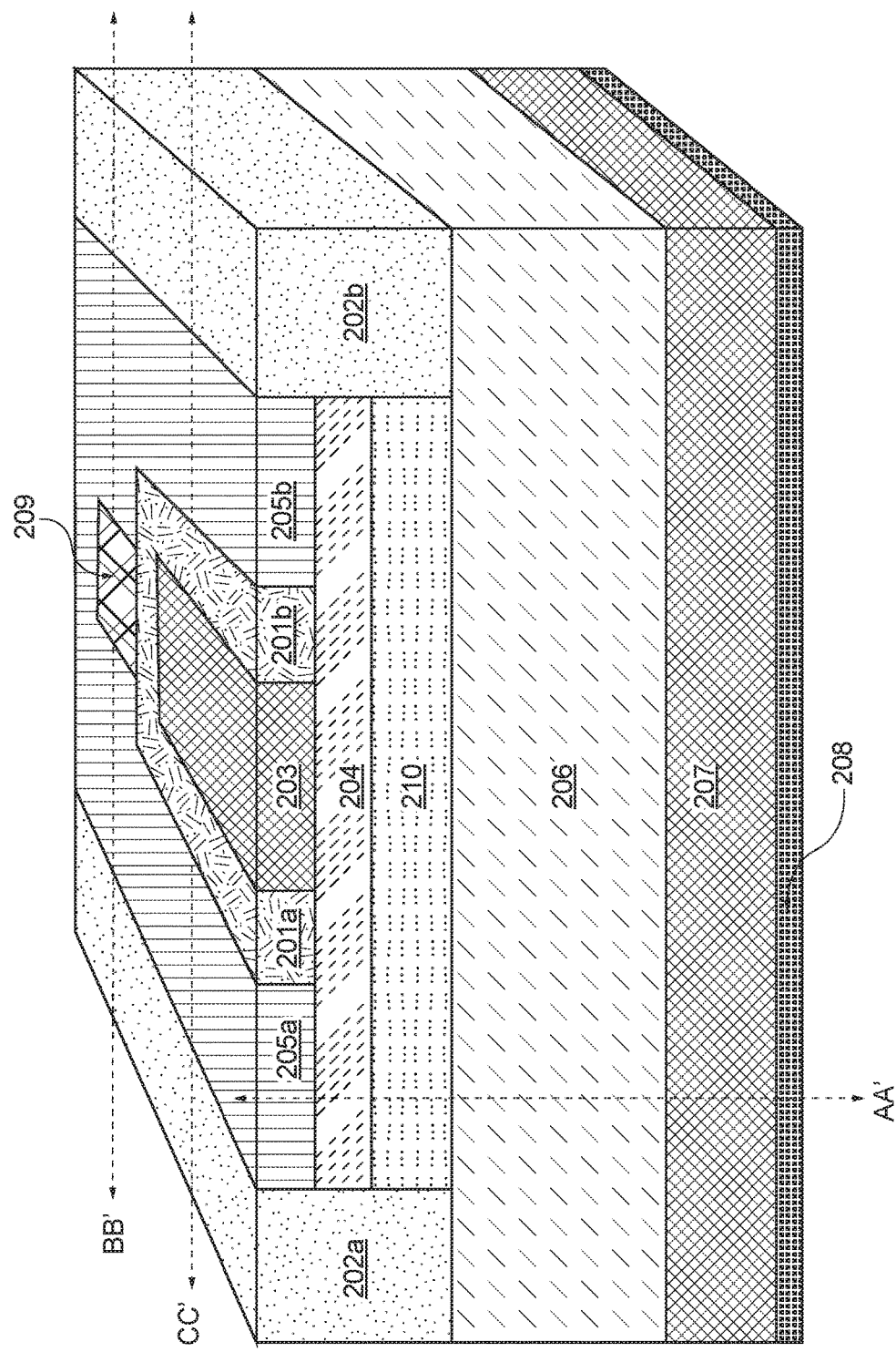
FIG. 2 is a perspective view of a section of an active cell of a first example multi-implanted JFET.

FIG. 2 shows the active cell of a first example of a multi-implanted planar JFET. At the center of the top surface is the source region 203. At the bottom, the drain contact 208 is in contact with the substrate drain region 207. The voltage-blocking drift region 206 is on top of the drain 207. The drift 206 may be formed as an epitaxial layer on top of the substrate drain region 207, for example. The multi-implanted JFET structure is formed by three gate regions 205a, 205b, and 210, along with an implanted horizontal channel region 204. The horizontal channel 204 leads to two implanted vertical channel regions 202a and 202b. There are separate top gate regions 205a and 205b, and a common bottom gate region 210. Current from the source 203 flows through the horizontal channel 204 to the vertical channels 202a and 202b. The vertical channels 202a and 202b bring the current to the drift region 206, from where it flows to the drain contact 208 via the drain 207.

The gate regions 205a, 205b and 210 are of the opposite doping type to the drain 207, drift 206, vertical channels 202a and 202b, horizontal channel 204, and source 203. Lightly doped regions 201a and 201b of either doping polarity may be used to increase gate-source breakdown voltage and/or add a source ballast resistance. For example, the lightly doped regions 201a and 201b may be doped at ten percent or less of the doping level of the adjacent source 203 or gates 205a and 205c. Alternatively, regions 201a and 201b may be left undoped/intrinsic, for example. Such added source ballast resistance may benefit device operation in short circuit mode, and is particularly useful when the JFET is employed as a current limiting device.

The use of lightly doped regions 201a and 201b is optional. The gate regions 205a and 205c may abut the source region 203, allowing tighter layout of the JFET.

The gate connection region 209 is the same polarity as the gate regions 205a, 205b, and 210, but a heavier implant is used to short the top and bottom gates and to provide a sufficient surface doping for good ohmic contact formation. The gate connection region 209 provides the gate voltage to both the top gate regions 205a and 205c and bottom gate region 205c. This use of a single contact for both gates allows a tighter design layout, as compared with the use of separate connections to the top and bottom gates, leading to more efficient use of wafer area.

Figure 3:
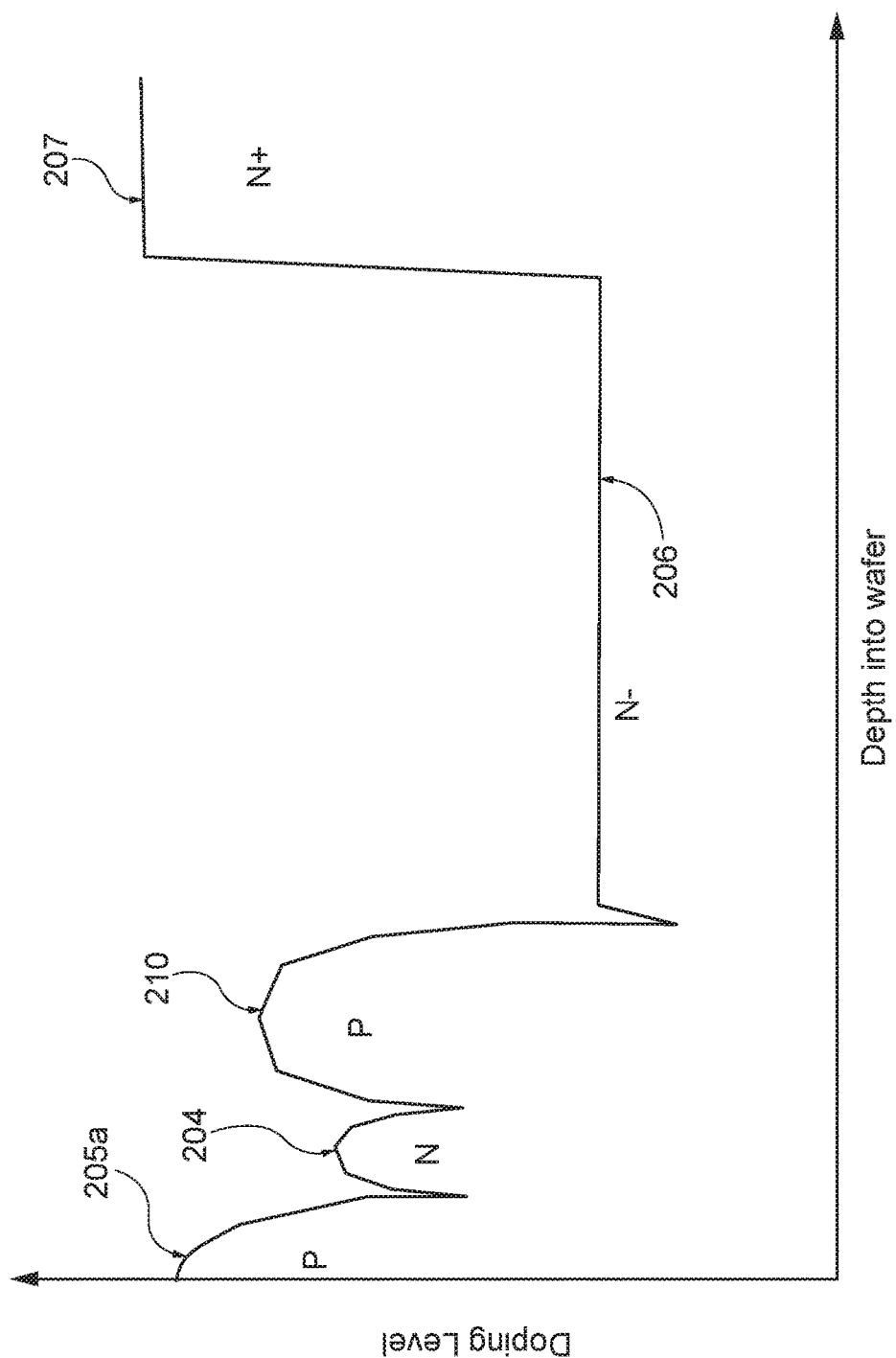
FIG. 3 is a doping profile graph of a multi-implanted JFET such as the first example multi-implanted JFET.

FIG. 3 shows an example doping profile for a multi-implanted n-channel JFET. For a device constructed as shown in FIG. 2, the profile of FIG. 3 may correspond to cross section AA' of FIG. 2. Referring now to FIG. 3, at the right is the N+ doping of the substrate drain region 207. To the left of this is the N− doping of the drift region 206.

At the left of FIG. 3 are the doping profiles of the three regions that may be implanted into the drift region 206 using a common hard mask. At the far left, which corresponds to the top of the device, is a top gate 205a. Below the top gate 205 is a channel region 204. Below the channel region 204 is a lower or bottom gate 210. The top gate 205a junction depth is quite shallow, and doped enough to not deplete fully when the device is operated at its negative maximum gate-source voltage. The top gate doping is light enough to be easily compensated by the source contact implant which is of the opposite polarity type. The channel implant 204 usually has a peak doping lower than the top gate 205a, and is disposed deeper than top gate 205a. The bottom (or deep)

gate region 210 is formed by the highest energy implant to position it below the channel implant. Again, the charge in this region must be at least sufficient for this region to not be fully depleted when the device is operating in drain to source breakdown with maximum reverse gate-source voltage. On the other hand, this doping level is preferably not made too high, in order to minimize implant damage that could affect carrier mobility in the channel region 204.

Figure 4:
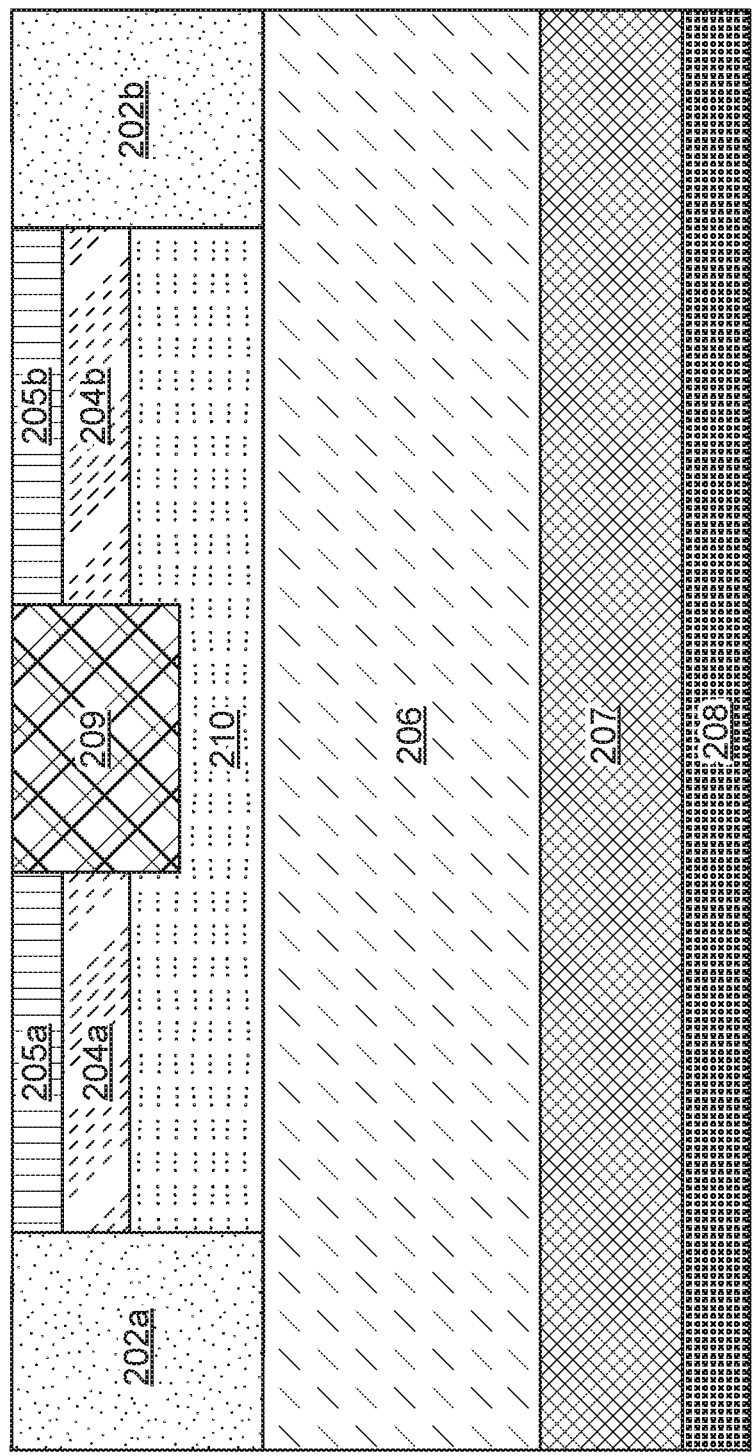
FIG. 4 is a vertical cross section of the first example multi-implanted JFET.

FIG. 4 shows vertical a cross section of the device of FIG. 2, taken along section BB' where the gate contact is made. The top gate regions 205a and 205a are connected to the bottom gate region 210 by the gate connect region 209. Region 209 is relatively heavily doped at the surface for good ohmic contact, and more moderately doped in the region between the two gates to compensate the channel region dopant. As a result, along cross section BB' region 209 splits the horizontal channel region into regions 204a and 204b to the left and right of 209. However, away from section BB' these regions 204a and 204b are connected as shown in FIG. 2 as region 204.

Figure 5:
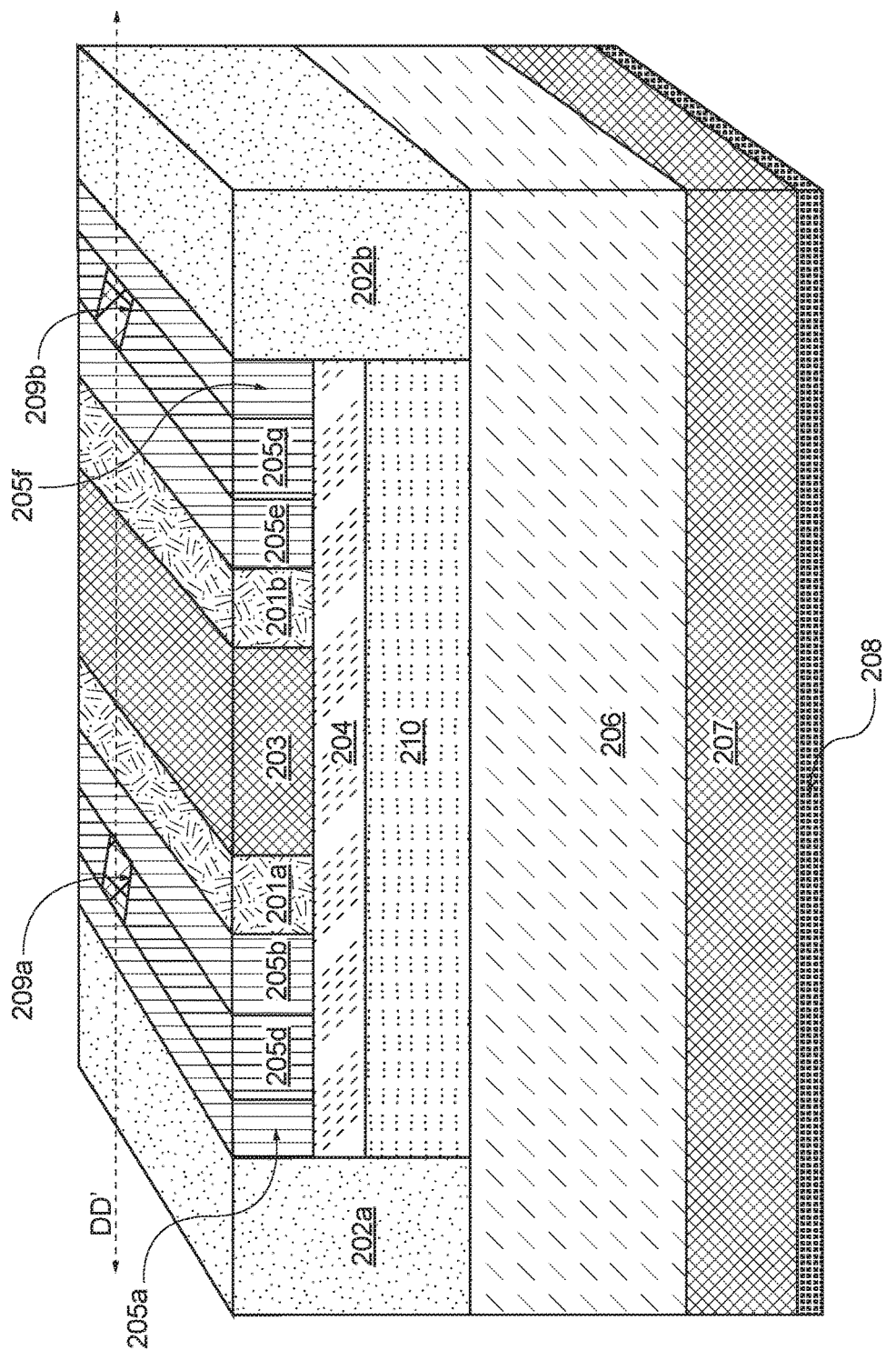
FIG. 5 is a perspective view drawing of an active cell of a second example multi-implanted JFET.

FIG. 5 shows the active cell of a second example of a multi-implanted JFET. In this device, the current from the central source region 203 flows to the left through the horizontal channel region 204 between the upper gate regions 205a, 205b, and 205d and lower gate region 210 into vertical channel regions 202a. Current also flows from the source 203 to the right between upper gate regions 205e, 205f, and 205g and lower gate region 210 to vertical channel region 202b. From the vertical channel regions 202a and 202b, the current flows to the drift region 206, then through the substrate 207 to the drain contact 208. As in the first example JFET of FIG. 2, here in FIG. 5 the transistor has both top gates regions 205a, 205b, 205, d, 205e, 205f, and 205g, and a common bottom gate 210. Here the gate ohmic contact regions 205d and 205g are disposed along the channel, and may be much more heavily doped, and shallower than the top gate regions 205a, 205b, 205e, and 205f. Lightly doped regions 201a and 201b of either doping polarity may be used to add source ballast resistance, and/or improve gate-source breakdown voltage. The lightly doped regions 201a and 201b may be doped, for example, at ten percent or less of the level of doping of the adjacent source 203, or of the gates 205b and 205e. The gate contact zones 209a and 209b connect to both the gate ohmic contact regions 205d and 205g and the lower gate regions 210.

Figure 6:
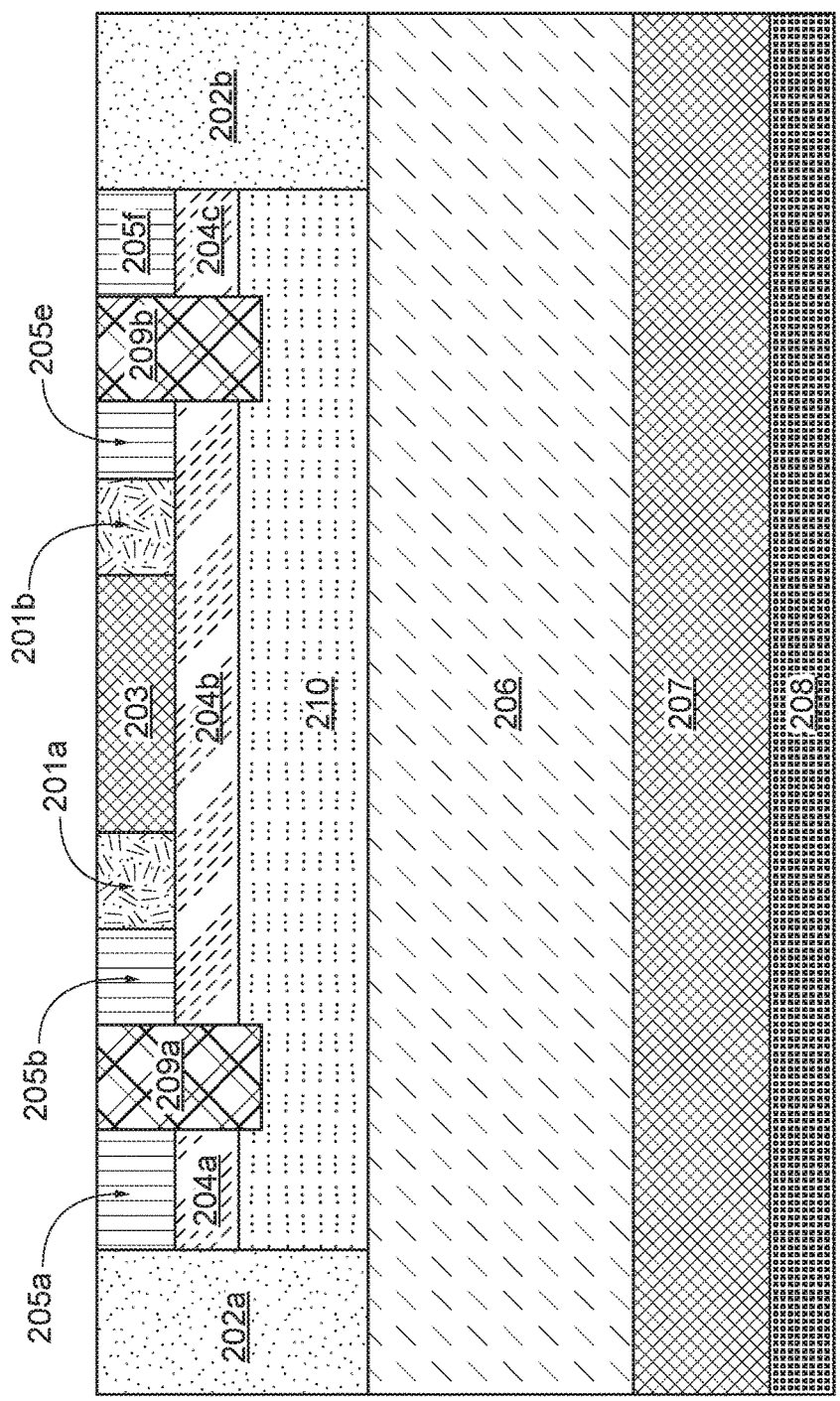
FIG. 6 is a vertical cross section of the second example multi-implanted JFET.

FIG. 6 shows a cross section of the device of FIG. 5 along section DD'. An additional mask and implant may be used to form the deeper gate contact zones 209a and 209b that connect to the lower gate region 210. Note how here the horizontal channel region is divided into regions 204a, 204b, and 204c along section BB' by the contact zones 209a and 209b, whereas away from section BB' region 204 is contiguous.

Figure 7:
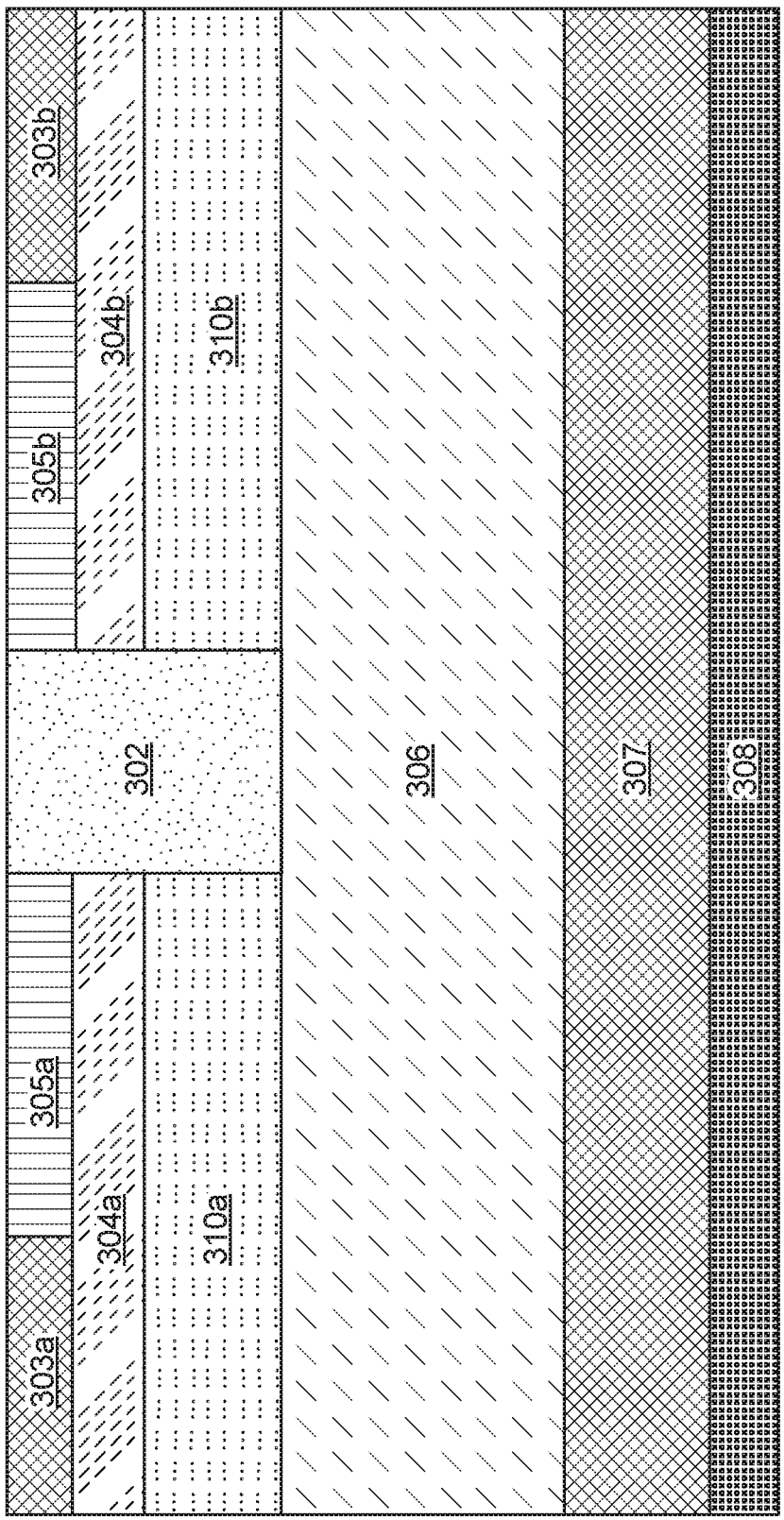
FIG. 7 is a vertical cross section showing the interconnection of gate structures in an example multi-implanted JFET.

FIG. 7 shows an example active cell that is similar to the example multi-implanted JFET shown in FIG. 4, where the vertical channel region 302 is at the center of the cell. In FIG. 7, the device is shown in effect to have two series connected JFETs, one that is lateral, and one that is vertical. The lateral JFET is split into two parts. On the left side, the current flows from the source region 303a laterally via the horizontal channel region 304a to the common vertical channel region 302, passing between the gate regions 305a and 310. Similarly, on the right side, the current flows from source 303b laterally via the channel region 304b to the common vertical channel region 302, passing between the gate regions 305b and 310b.

The vertical JFET is formed by the combination of bottom gate regions 310a and 310b and the vertical channel region 302. The current from lateral channels 304a and 304b flows down the vertical channel 302 between the gate regions 310a and 310b, and then into the drift region 306, and from there into the substrate drain region 307 and ultimately to the drain contact 308.

The lateral JFET sets the device threshold voltage (Vth.) The vertical JFET is useful in shielding the lateral channels 304a 304b from the effects of high drain bias once the region between 310a and 310b has been depleted. In making devices where low on-resistance and short channel lengths are required, this feature allows the designer to make the lateral channels quite short without suffering from drain bias induced barrier lowering and the loss of blocking capability. This is particularly useful in making normally-off JFETs. In the case of 4H—SiC normally-off JFETs, the device Vth must ideally be kept close to 1V with +/−0.2V control. This is because the gate drive voltage should be kept between 2.5-3V to limit the maximum gate current that results from forward biasing the gate-source junction. Given that the overdrive voltage available is just 2.5V−1V=1.5V, a short channel is needed to get a high on-state current. In the trench structure, this is not possible without degrading the blocking capability of the device, so a high cell repeat density must be used. The shielding effect of the lower gate may be employed to minimize channel length. By disposing the peak of the channel implant close to the top gate junction, a higher channel charge is also possible for the same Vth, further allowing a high transconductance for normally-off devices.

While connecting the bottom gate regions 310a and 310b to the gate potential instead of to the source potential increases the gate-drain capacitance, doing so serves the purpose of depleting both the lateral channels 304a and 304b and the vertical channel 302 channels much more effectively. This in turn allows a greater doping level in the lateral and vertical channel 302, leading to lower specific on-resistance.

Figure 8:
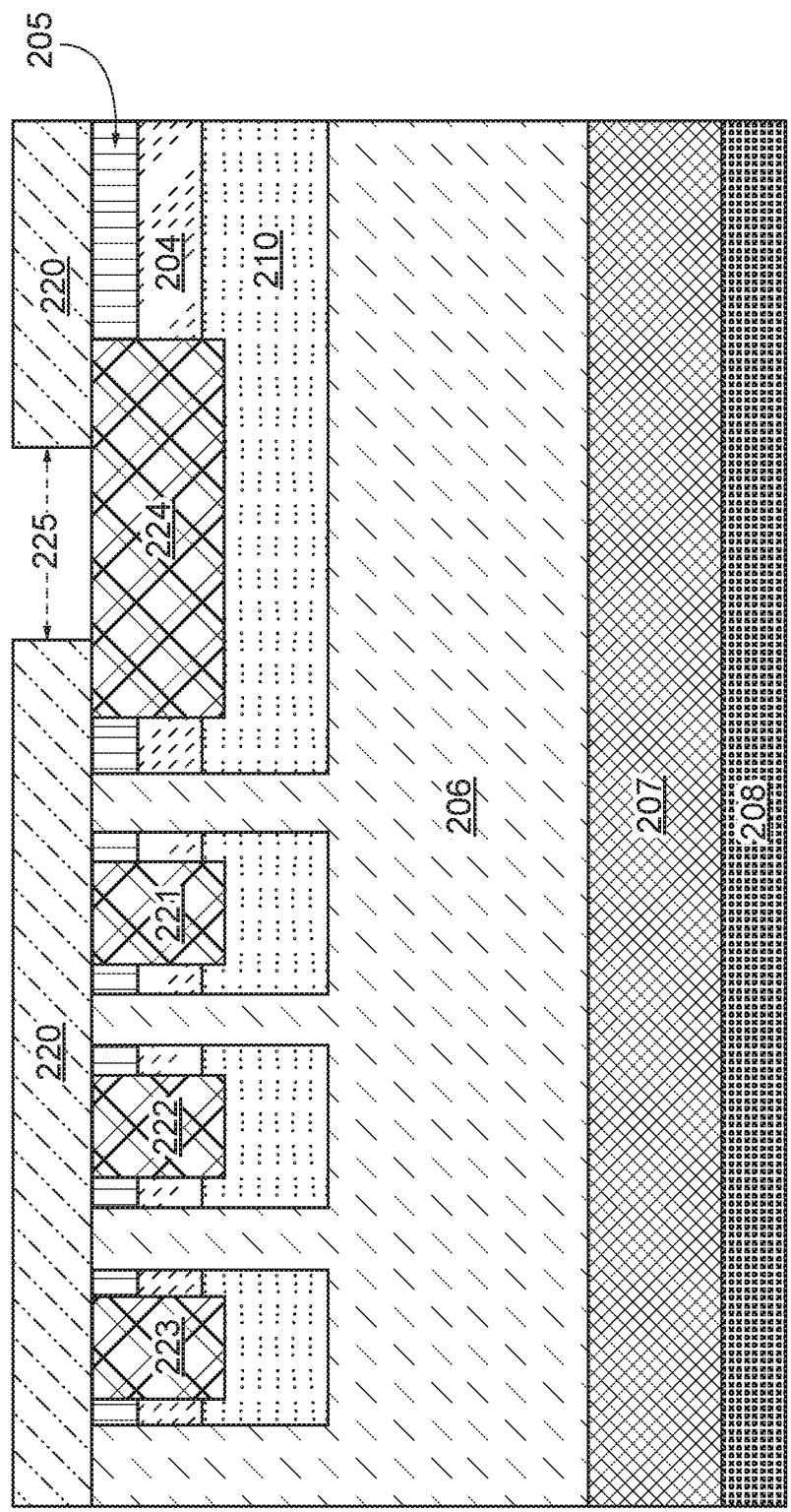
FIGS. 8 and 9 are vertical cross sections of termination regions of example multi-implanted JFETs showing how the same set of implants may be used to form the gate pickup areas as well as the termination guard rings.

FIG. 8 shows how gate bus and gate pad pickup areas may be formed adjacent to the termination zone of multi-implanted JFET devices, e.g., for the device shown in FIG. 2. In FIG. 8, a passivation dielectric 220 lies above the termination zone. Implanted region 224 bridges the top gate 205 and bottom gate and 210 layers through the intervening horizontal channel implant region section 204. Implant 224 has a heavy surface doping for good ohmic contact. A contact gap 225 in the dielectric 220 may be used to connect to the gate bus that distributes the gate signal around the device. The termination may use floating guard rings 221, 222, and 223 using the same material that is used to form the same gate bridging implant 209. Of course, other known techniques of junction termination may be independently applied to the device.

Figure 9:
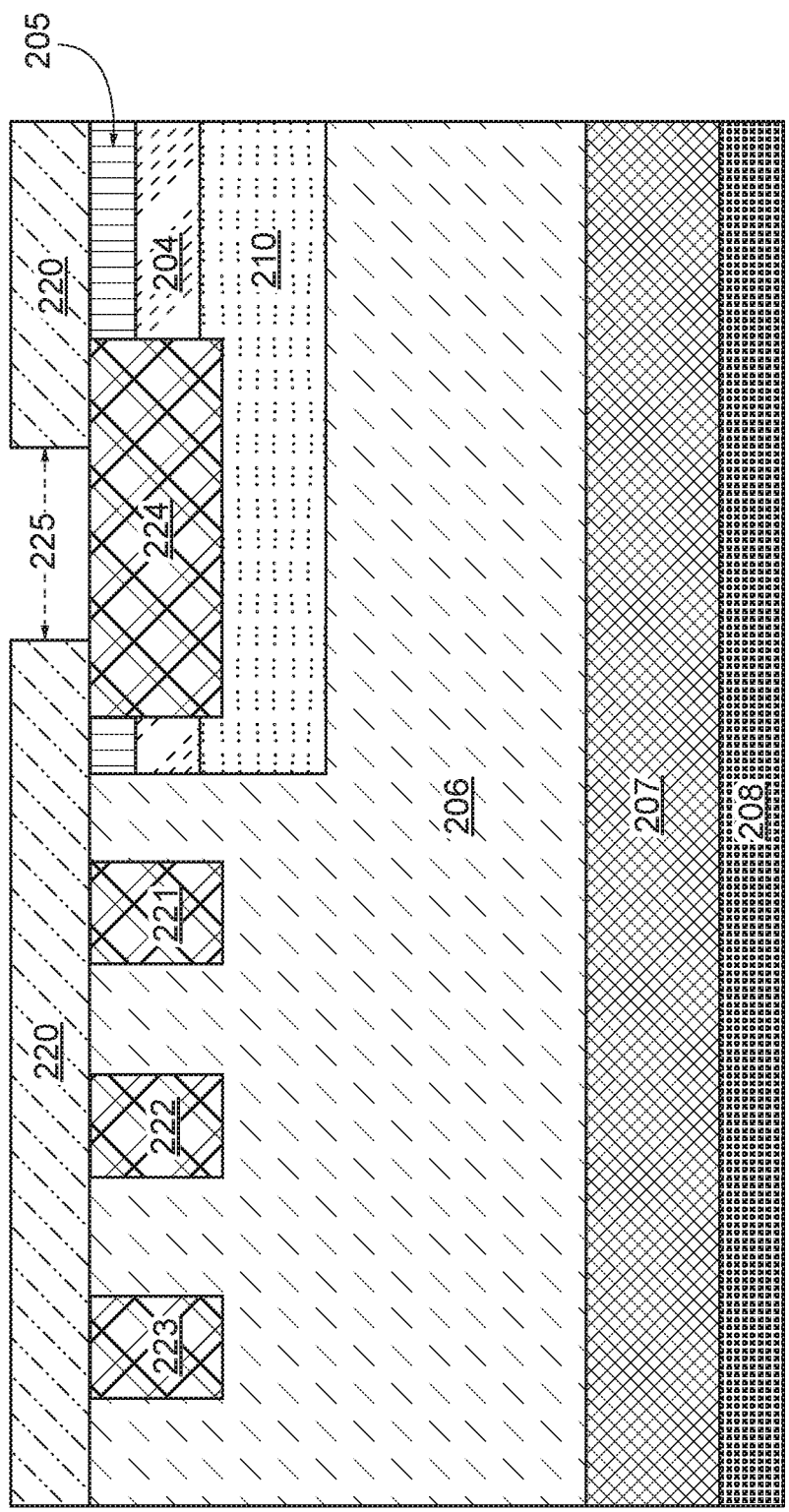

FIG. 9 is similar to FIG. 8. The difference in the example of FIG. 9 is that the guard rings are formed only using the heavier implants used to form the bridge between the top and bottom gates, but the top and bottom gate implants are not used for the guard rings.

FIGS. 10 to 18 show an example of a method for the manufacture of a multi-implanted JFET in a high-bandgap semiconductor material such as 4H—SiC. For purposes of illustration, FIGS. 10 through 18 show the construction of the first example multi-implanted JFET as described in reference to FIG. 2. However, it will be appreciated that this method, and variations thereof, may also be used to create a variety of multi-implanted devices including, but not limited to, the second example JFET discussed in reference to FIG. 5. Similarly, the device may be fabricated with variants of this flow in different materials to achieve the similar structures.

Figure 10:
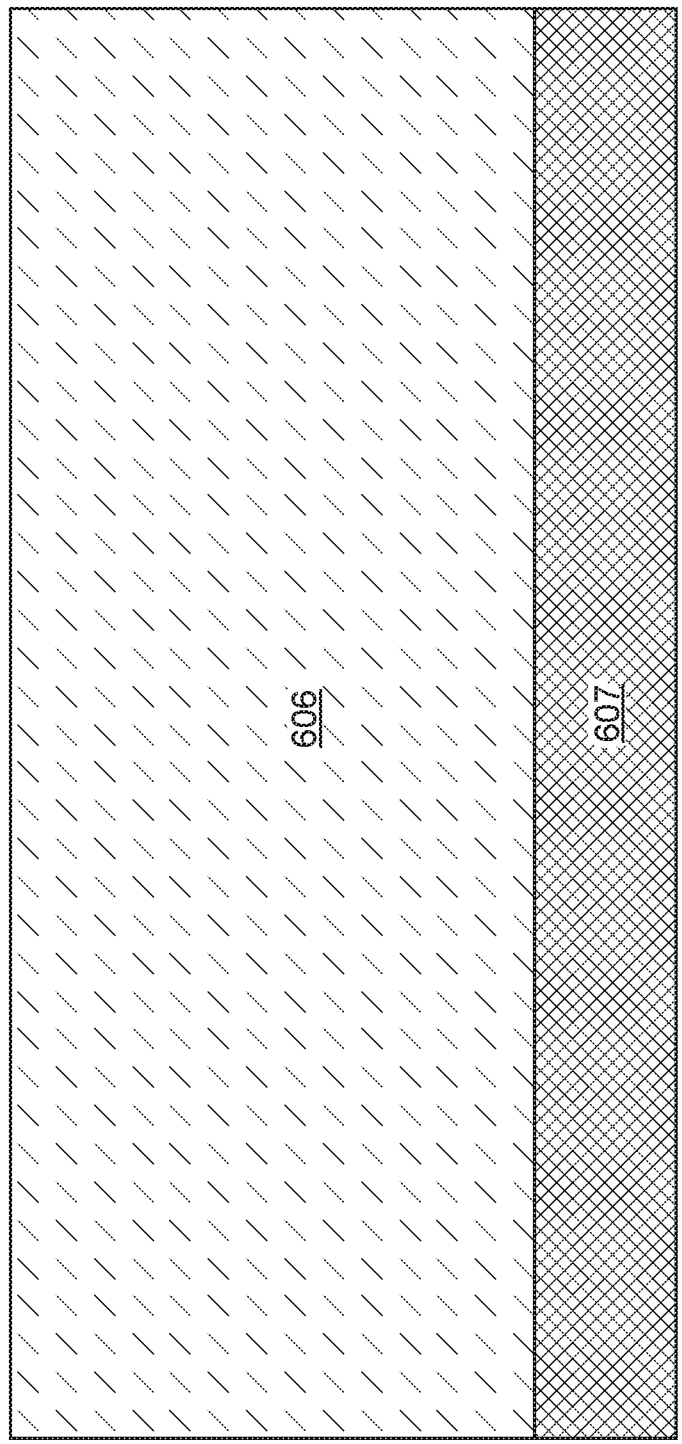
FIGS. 10-18 illustrate an exemplary method for fabricating multi-implant JFETs.

FIG. 10 is a vertical cross section of the shows starting material, which consists of the drift region 606 on top of the substrate 607. Both are of a first doping type. The drift 606 may be grown epitaxially on the substrate 607.

Figure 11:
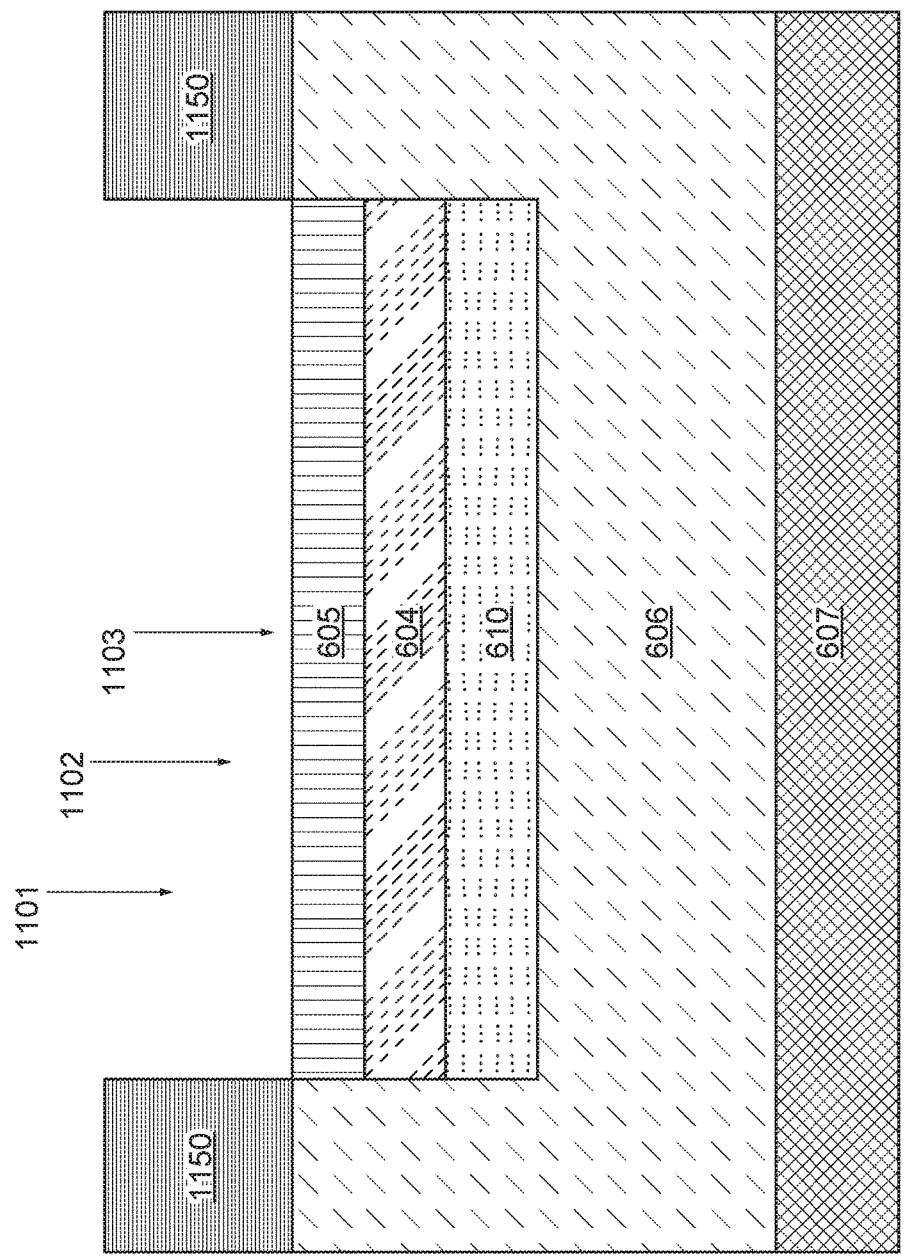

FIG. 11 shows the start of the method. A thick patterned mask 1150 capable of blocking all the subsequent implants is formed on the surface. In this example, three implants, 1101, 1102, and 1103 are applied and affect the unmasked areas of the drift 606. Top gate region 605 is created with a low energy implant 1101 of the second doping type. Bottom gate region 610 is created with a high energy implant 1102 of the second doping type. With the same mask, the channel implant 1103 is also performed to create the channel region 604. Thus the top gate 605, bottom gate 610, and channel 604 are self-aligned. Thereafter mask 1150 may be removed. In the case of an n-JFET in 4H—SiC, mask 1150 may be a thick oxide hard mask, for example, to block high temperature Al implants for the top and bottom gates, and an N implant for the channel.

Figure 12:
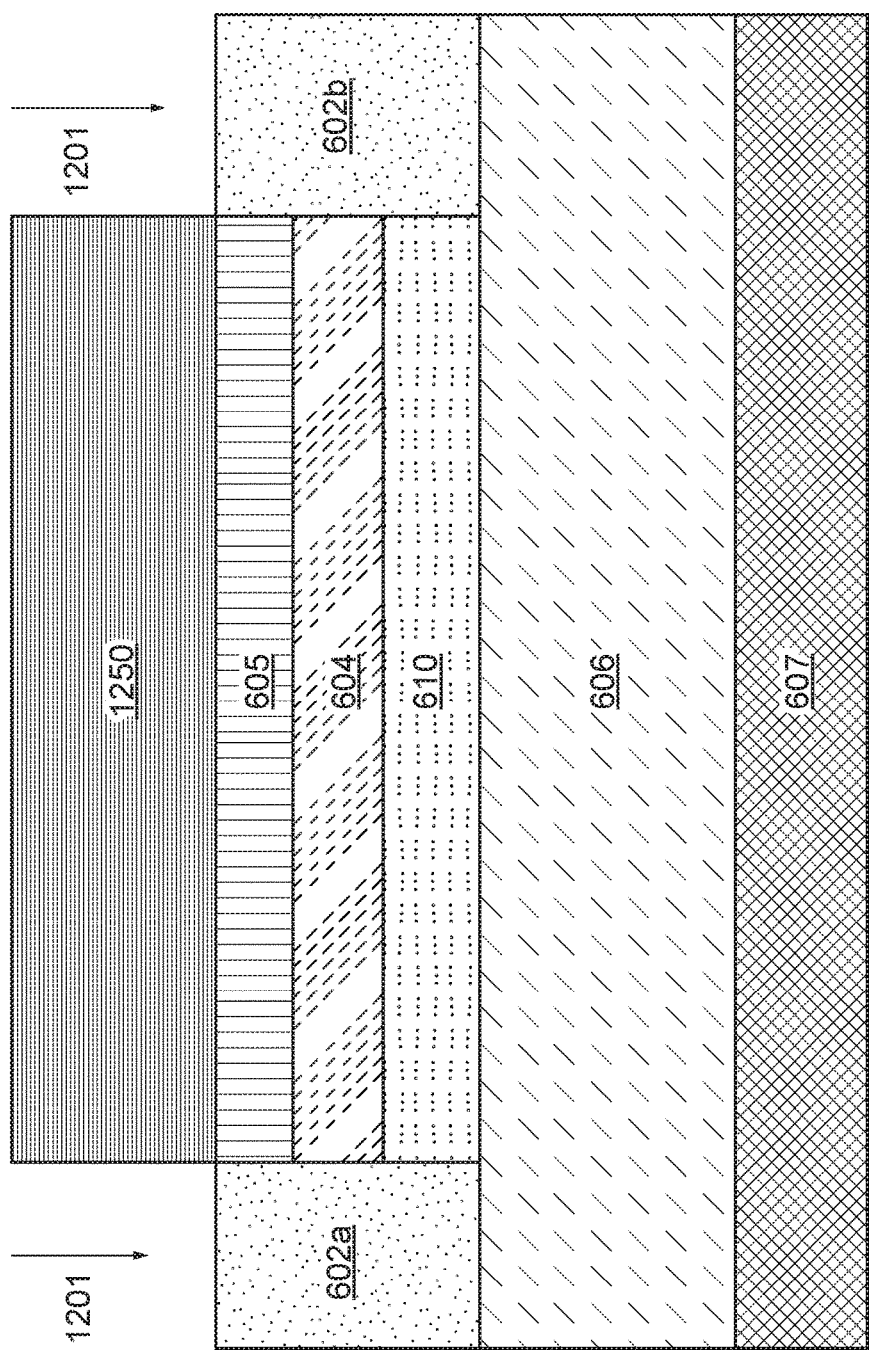

In FIG. 12, a new mask 1250 is applied. Mask 1250 blocks implantation of regions 604, 605, and 610 in the active cell area. Not shown in FIG. 12, mask 1250 may also be used to block implants in the regions outside of the active cell array. This includes areas such as the gate bus, gate pad, and termination regions. Mask 1250 is opened between the multi-implanted zones in the active area. An implant 1201 of the second doping type is then applied to form vertical channel regions 602a and 602b in the exposed drift regions. This implant may be designed with an overlap into the channel defined by the previous mask in order to mitigate threshold voltage variations from edge effects caused by hard mask slope and deep gate implantation ion scattering. The implant may also be designed to have a depth deeper than the bottom gate in order to optimize the trade-off between breakdown voltage and reduced on-resistance from current spreading. Mask 1250 is then removed. In a 4H—SiC n-JFET, Mask 1250 could be either a hard mask or a photoresist mask, for example.

Mask 1250 may also be opened at the outer termination edge for the creation of a channel stop, along with the subsequent source implant.

Figure 13:
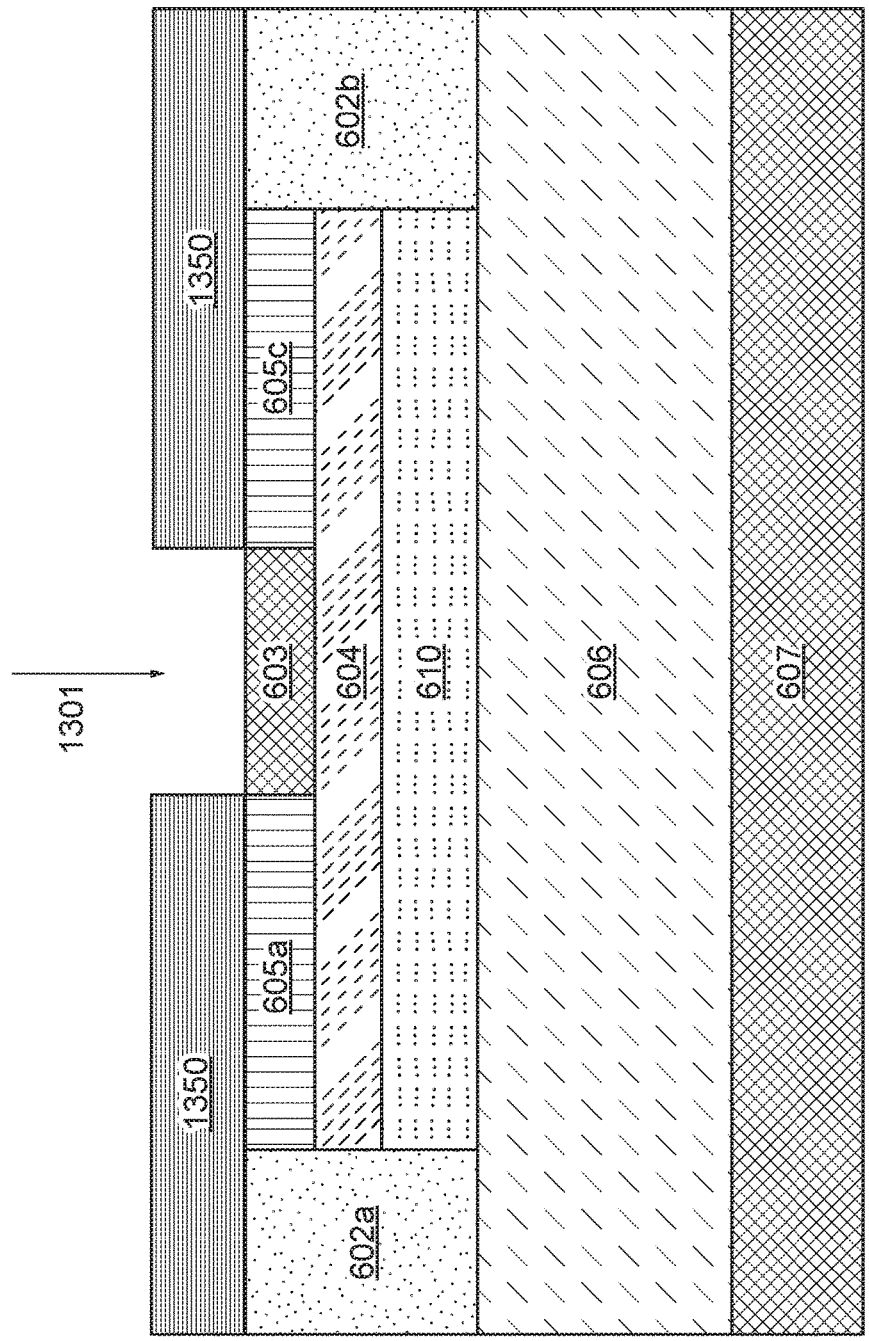

In FIG. 13, a mask 1350 is applied to pattern an implant 1301 of the first dopant type. Implant 1301 is used to create a source region 603, thereby splitting the gate top into regions 605a and 605c. Mask 1350 may then be removed. Mask 1350 may be, for example, a hard mask or a photoresist mask.

The energy of implant 1301 is selected to balance design considerations. Region 603 should be deep enough to connect to the channel 604. However, it is preferable that implant 1301 does not increase the doping at the junction of the channel 604 to bottom gate 610. This avoids or reduces any loss of gate-source breakdown or any increased leakage in the gate-source junction. Of course, the designer may also tune this depth. For example, a specific zener clamp voltage may be desired between the gate and source.

Figure 14:
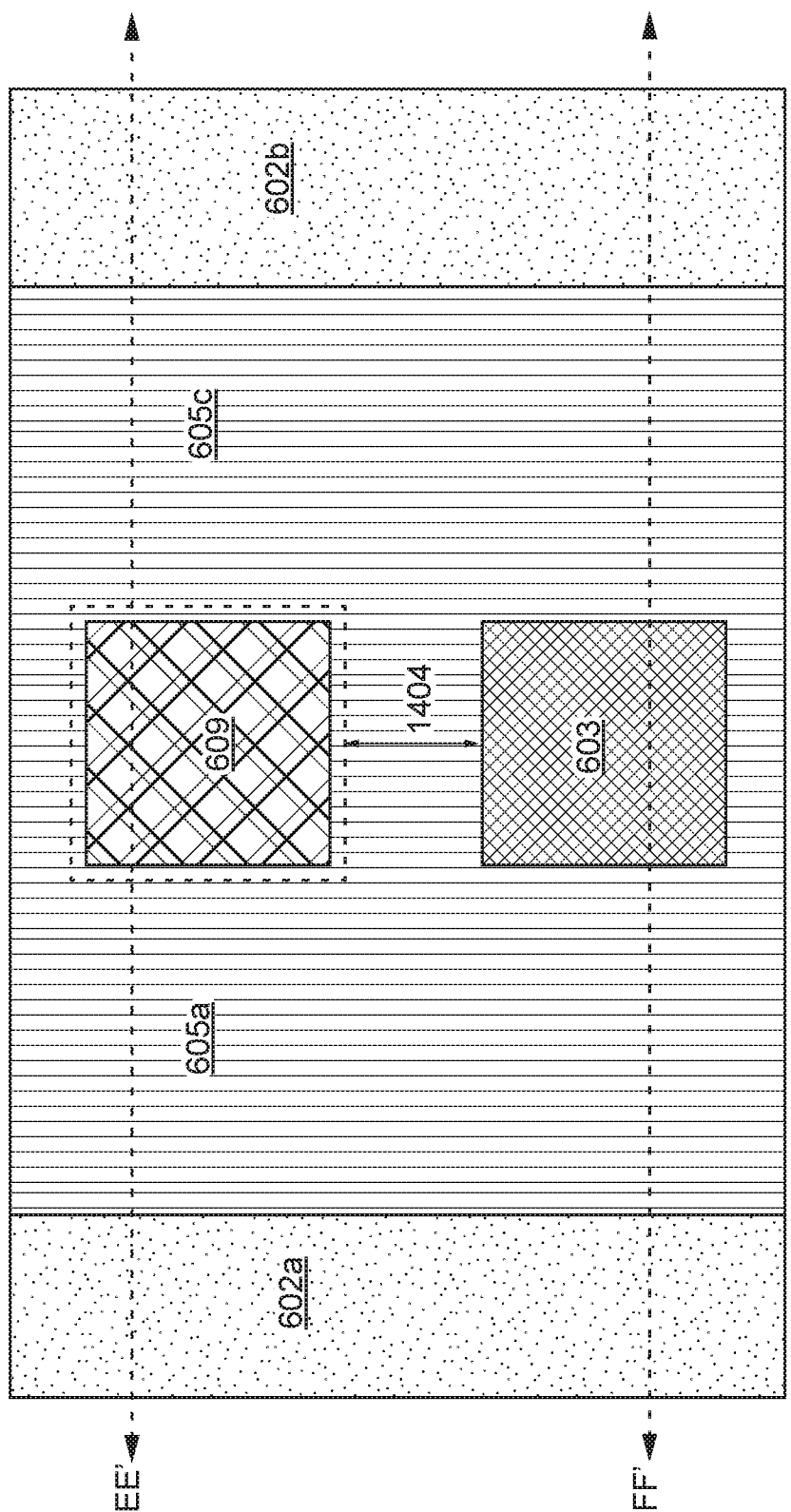

FIG. 14 shows a top view of the wafer in process. A mask (not shown) with an opening in is applied, allowing gate contact region 609 to be created through the opening via implantation. The implantation may include both gate surface enrichment implant and a gate top to gate bottom bridging implant. The former aids ohmic connection to the gates. The latter connects the top and bottom gate layers. To allow for mask alignment tolerances, a minimum gap 1404, e.g., 0.1 to 0.5 microns may be maintained between the heavy doped source region 603 and gate contact ohmic region 609. This aids in maximizing gate-source breakdown and minimizing leakage.

Figure 15:
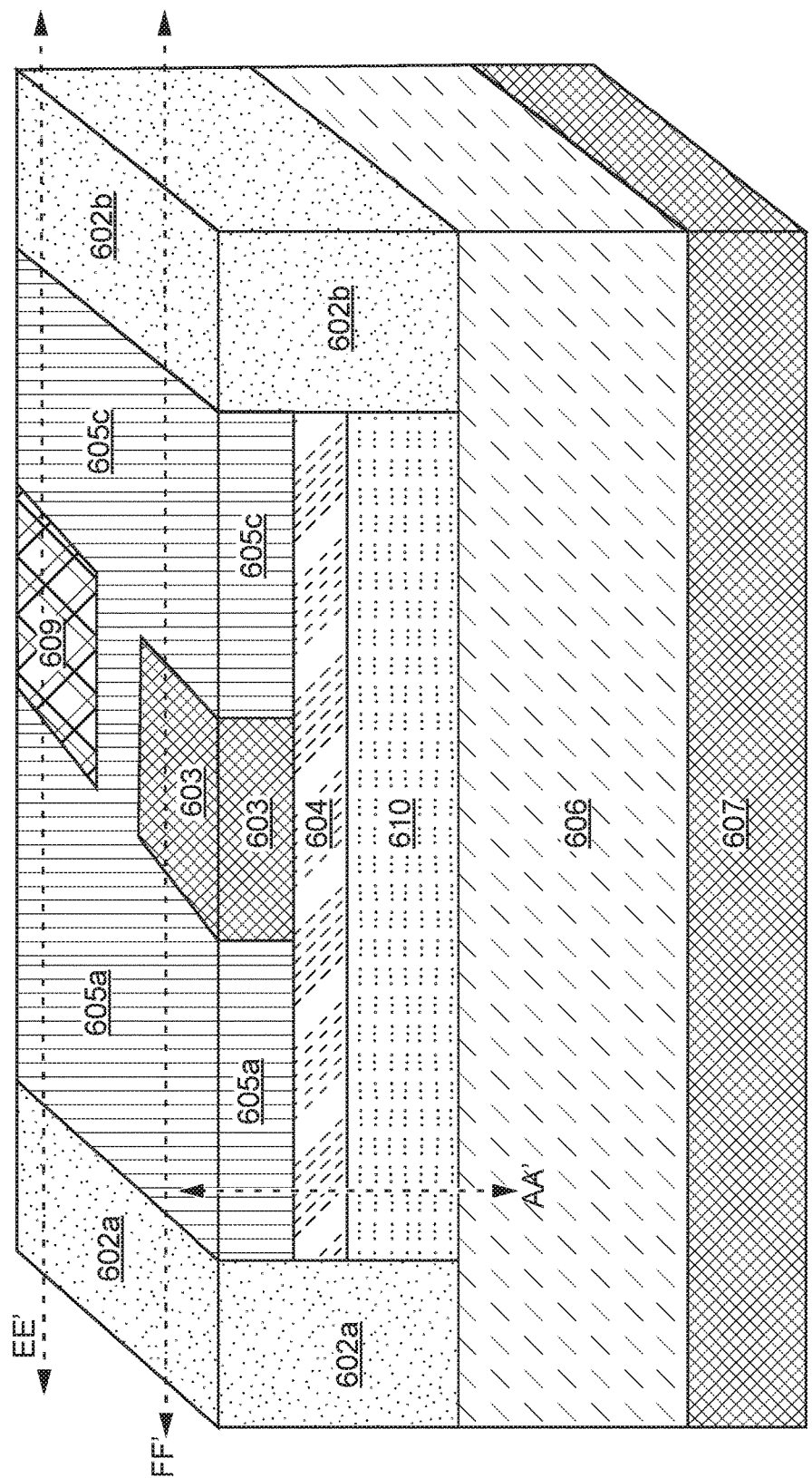

FIG. 15 shows the cell after all implants are done and all mask films are stripped prior to implant anneal. In the case of a 4H—SiC device, for example, implant anneals may be carried out at temperatures exceeding 1600 degrees C., with a graphite cap to prevent surface degradation, as well as other techniques commonly used in the art.

Figure 16:
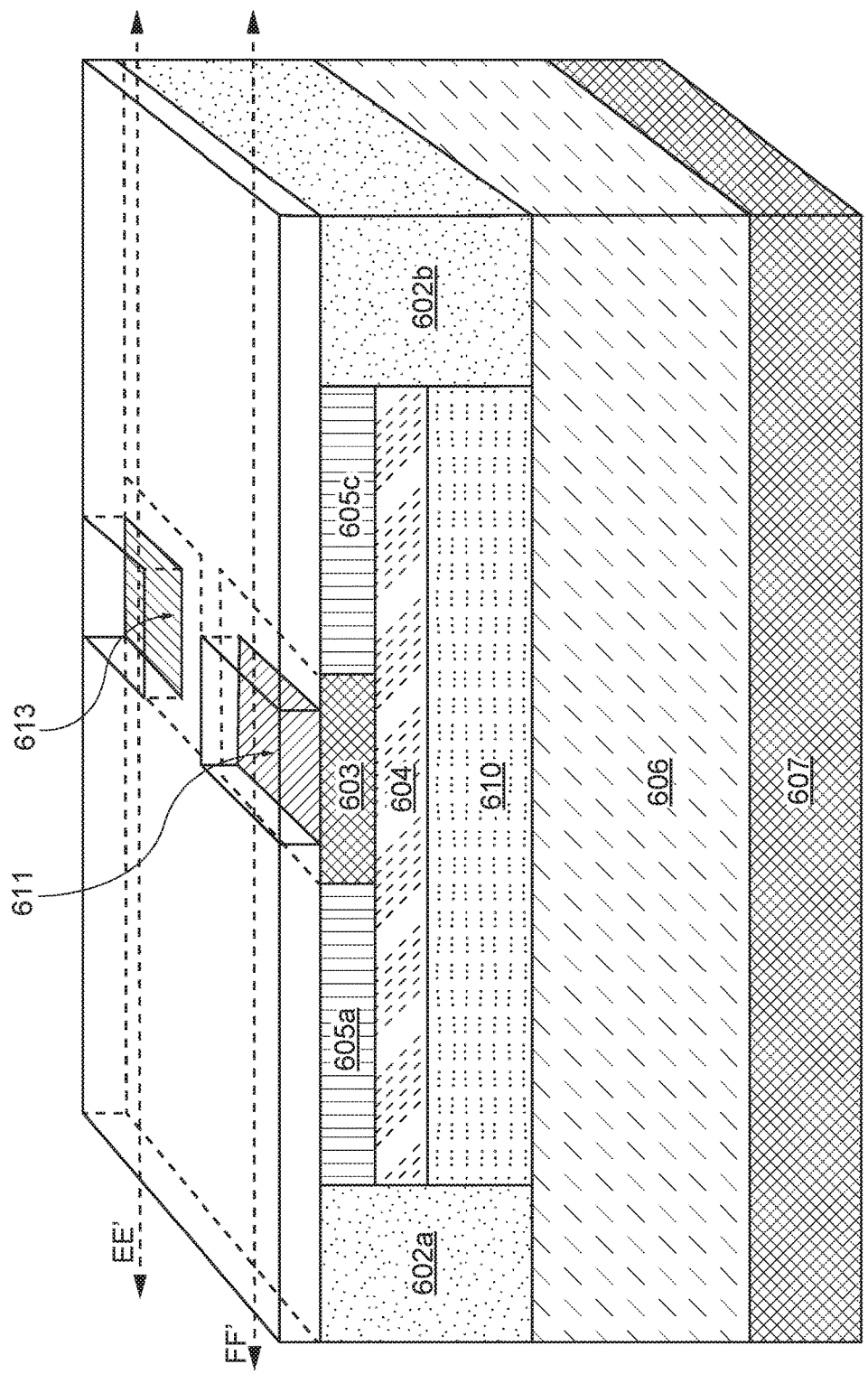

Once the implants are activated, the surface is cleaned and a dielectric is deposited. FIG. 16 shows a 4H—SiC device, for example, with an oxide mask, opened at the separate source 603 and gate connection region 609. A two-step silicidation process may be used to form a source silicide region 611 and gate silicide region 613 over the source 603 and gate connection region 609, respectively, with NiSi2, for example. Alternatively, a two-mask approach may be used to form separate silicides in the N- and P-regions by opening each contact zone in turn. Gate contact 609, which lies under silicide 613, is not visible in this view.

Figure 17:
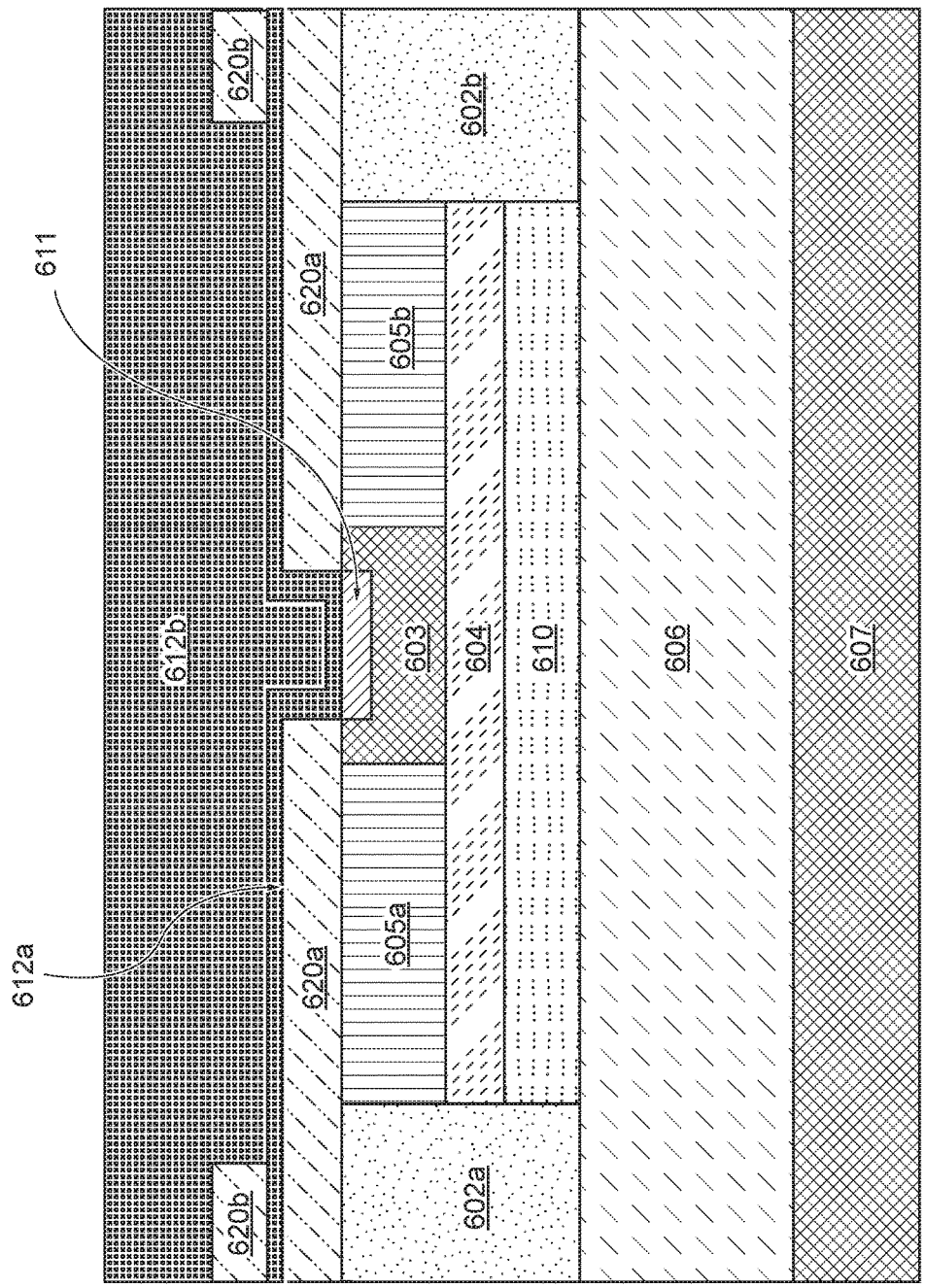

FIG. 17 shows the device cross section though the source contact along section FF' of FIG. 16. A first dielectric 620a is deposited on the top of the wafer and patterned to expose the source contact silicide 611. A first conductor layer, including a source potential trace 612a, is then deposited over the first dielectric 620a. The conductor 612a may be a composite layer, such as titanium topped by titanium-tungsten (Ti/TiW), for example. Then a second dielectric 620b is deposited and patterned with a mask to expose a portion of the source trace 612a. This is followed by the deposition and patterning of a final conductor layer that includes source potential trace 612b. The final conductor layer may also be a composite layer, such as titanium topped by aluminum (Ti/Al), for example. A thick aluminum layer is typically suitable for active area bonding for high current devices.

Figure 18:
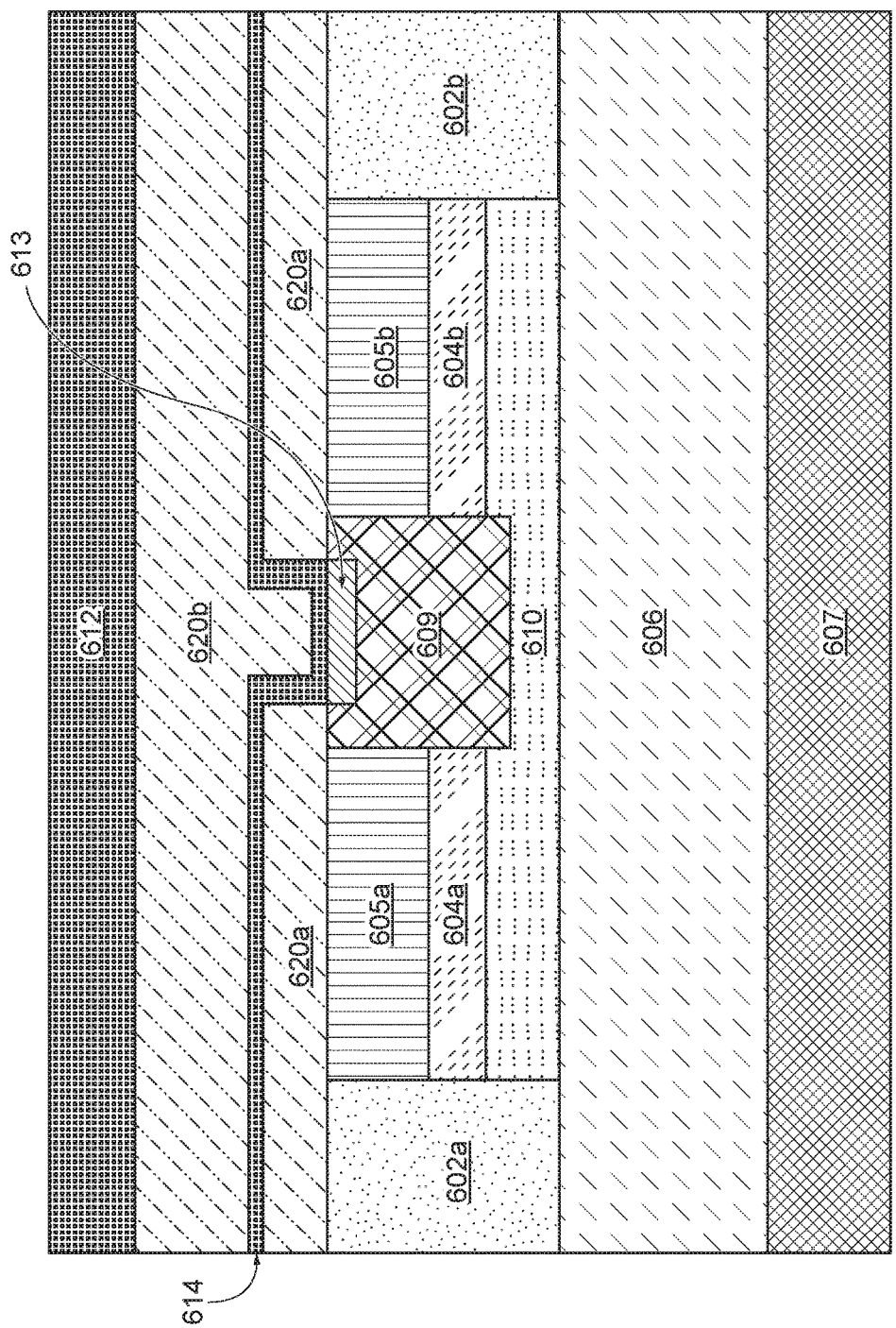

FIG. 18 shows a vertical cross section in the gate pickup region, e.g., along section EE' of FIG. 16. This shows the active area after the steps described in reference to FIG. 17 are completed. Referring to FIG. 18, the first metal layer includes a gate potential trace 614 that connects to the gate contact 613. The gate silicide 613 in turn that makes contact to the top gates 605a and 605b, and the bottom gate 610 via the heavily doped gate connection region 609. The trace 614 is patterned so that the line running to the gate is isolated from the source. The trace 614 serves to bring the gate signal to the gate bus at the device periphery. The second dielectric region 620b isolates the gate trace 614 from the source trace 612 everywhere in the active area. Dielectric region 620a keeps the gate trace 614, which may be thin, isolated from the underlying JFET cell.

Figure 19:
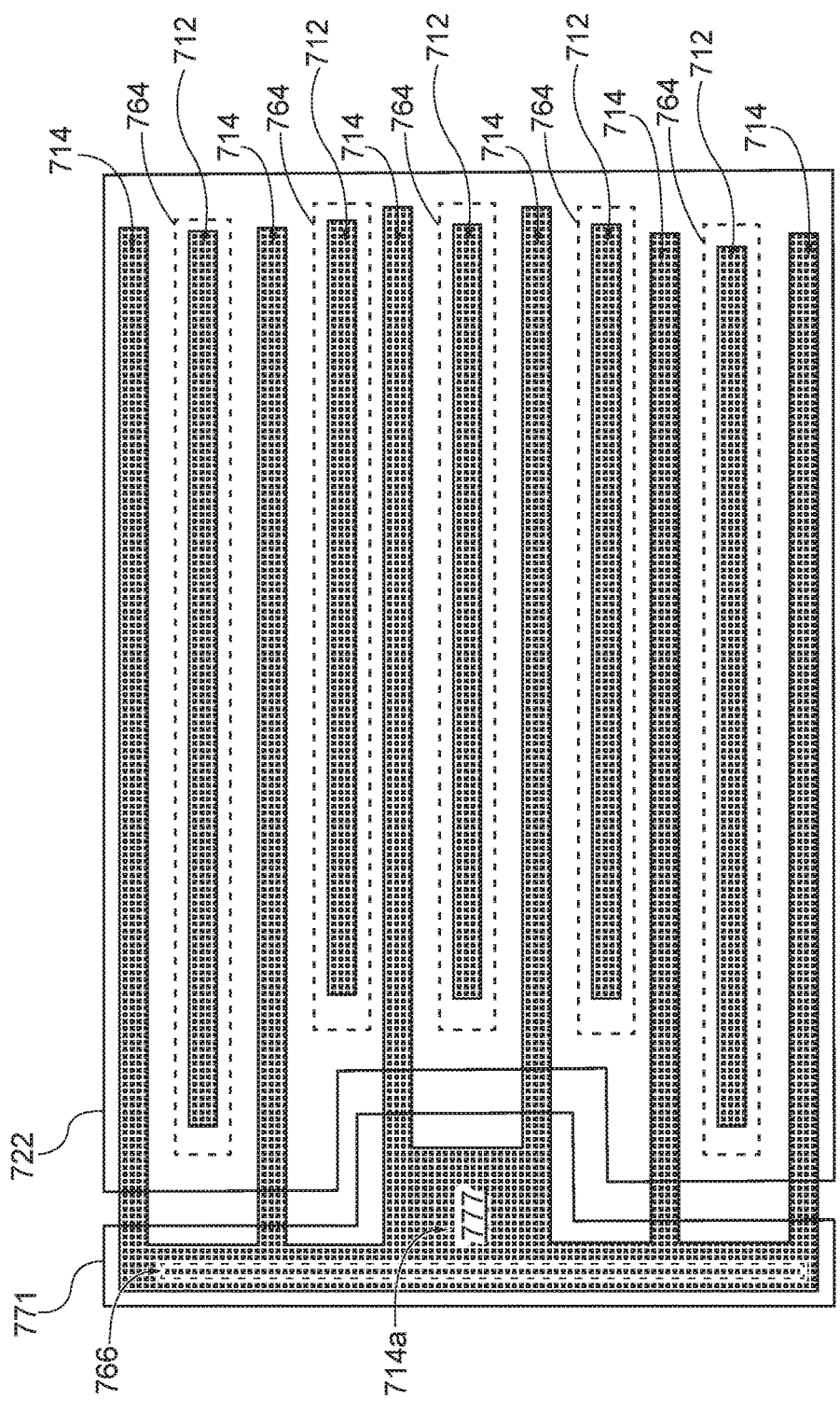
FIG. 19 is a top view showing an exemplary layout of the metal layers of a multi-implanted JFET, including both the active and termination regions.

FIG. 19 shows a top view of a simple stripe active cell layout of an example device. The regions 714 with dashed outlines are gate metal lines formed in the first thinner metal layer. They connect at the edge of the die on the left. Via 766 connects the gate metal lines 714 to the final, thicker metal in region 771, shown with a solid outline. Region 771 is the gate buss. Region 714a is a pad where a gate bond wire may be placed. The source regions are connected to a separate section 712 of the first, thinner metal layer. Vias 764 open a path through the upper dielectric connecting the source metal lines 764 to the source metal pad 772 formed in the upper metal layer. It will be appreciated that many design variations are possible to use the two metal layers to address the gate and source current distribution in multi-implanted JFET devices described herein.

Figure 20:
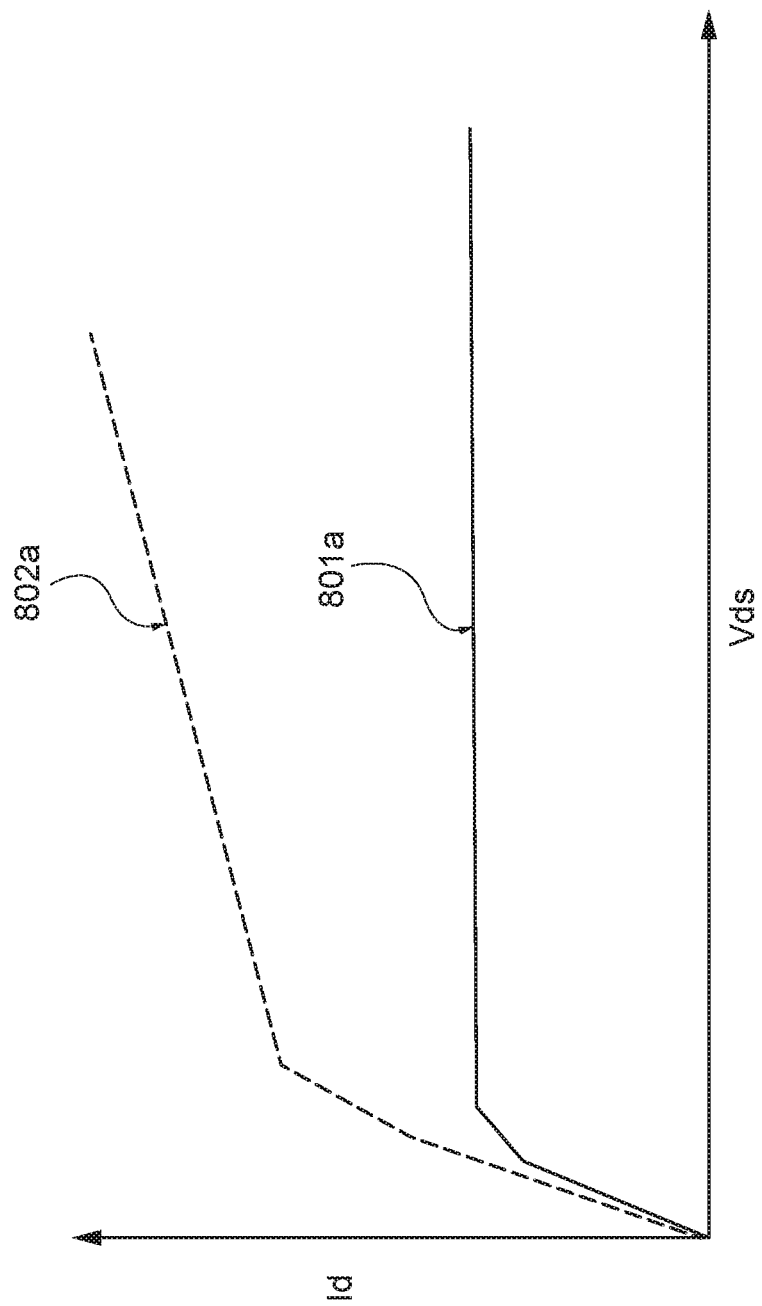
FIG. 20 is a graph of exemplary drain conduction versus drain-source voltage multi-implanted JFET devices versus prior art devices.

FIG. 20 shows the output drain current (Id) versus drain-source voltage (Vds) characteristics 801a of multi-implanted JFET devices as described herein as compared with the Id-Vds characteristics 802a of prior art devices. The flat current in curve 801a after saturation, and tight control over saturation current levels, are very useful for current limiting applications. They result from a number of factors, including the shielding effect of the lower gate and vertical channel region, the longer channel length based on lateral cell dimensions now possible without deep trench etching, and the ease with which a source ballast resistance may be formed within the cell.

Figure 21:
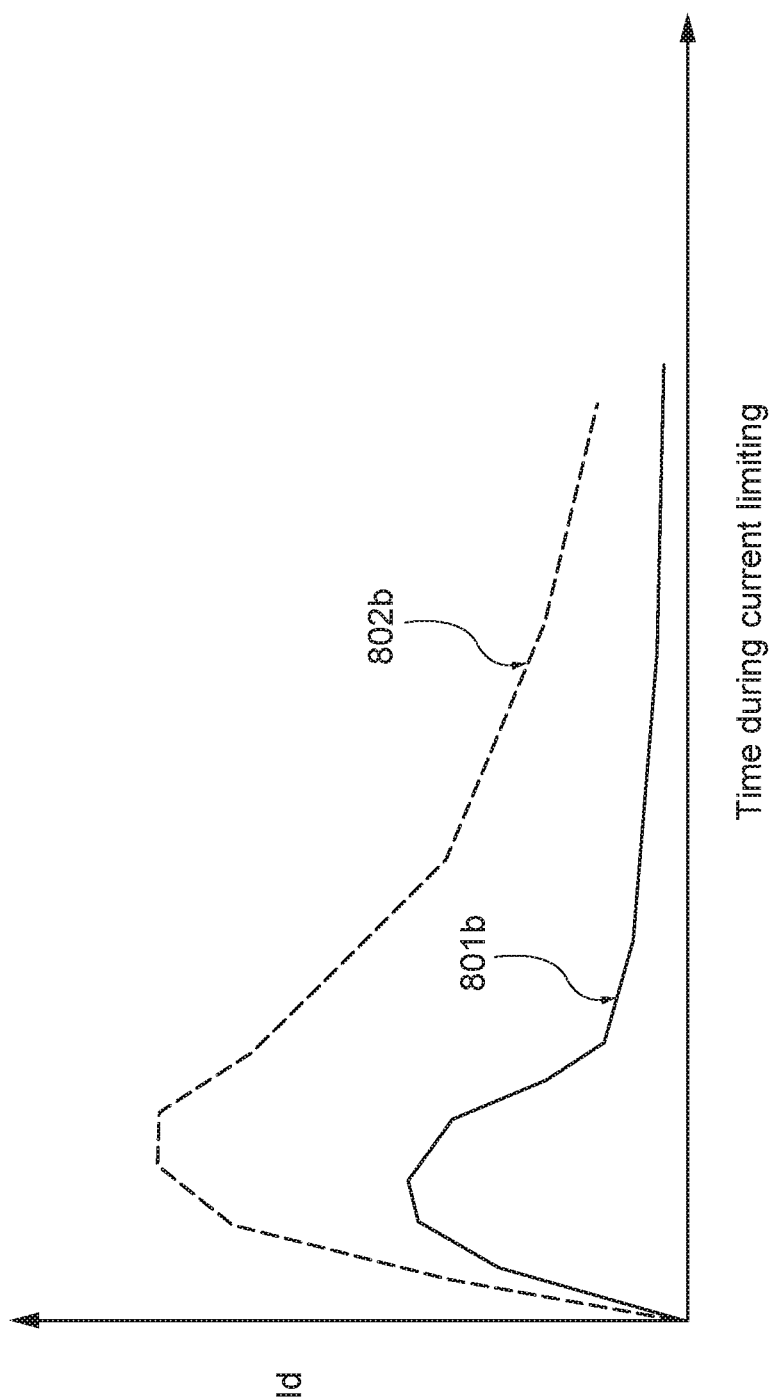
FIG. 21 is a graph of short-circuit transient performance of an exemplary multi-implanted JFET device versus the performance an exemplary prior art device.

FIG. 21 shows the results of the use of the source ballast resistance, e.g., a long channel length, on the device current versus time in response to a surge such as a lightning strike. Curve 801b is for a multi-implanted JFET device as described herein, and curve 802b is for prior art devices. The new structure lets through much lower energy, which may be estimated by integrating the area under the square of the current versus time curve. Another useful aspect of this structure is the low internal gate resistance (Rg) possible with designs using two metal layers. That in turn prevents any excess drain current due to dV/dt induced turn-on caused by a displacement current through the internal Rg.

Figure 22:
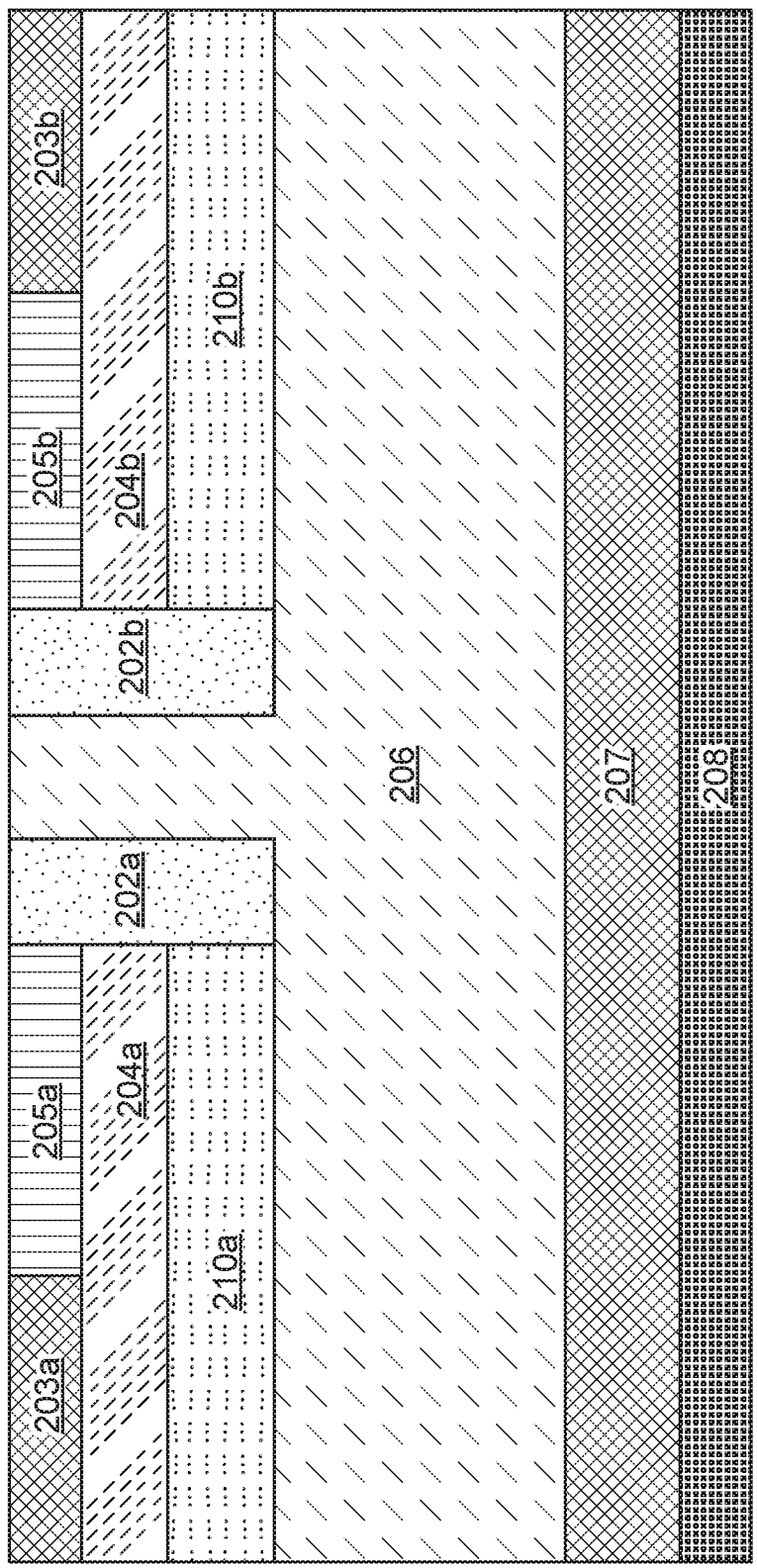
FIG. 22 is a vertical cross section of a third example multi-implanted JFET with a vertical channel region formed by angled implant using the same mask as used for the triple implant.

FIG. 22 shows a third embodiment, where the vertical channel JFET regions 202a and 202b are formed by angled implantation using the same mask window as that used for the triple implant that forms the top gate regions 205a and 205b, the bottom gate regions 210a and 210b, and the horizontal channel regions 204a and 204b. Using the same mask avoids any misalignment problems between the vertical channel and triple implanted zones. However, since JFET regions 202a and 202b may have a higher peak concentration than the channel regions 204a and 204b, it would require a significantly higher dose for the deeper gate 210a and 210b to ensure conversion to p-type behavior. On the other hand, the energy of the implants 202a and 202b may be selected to be high enough to form a current spreading layer under the deep gate to further enhance on-resistance at the expense of a lower device breakdown voltage.

Figure 23:
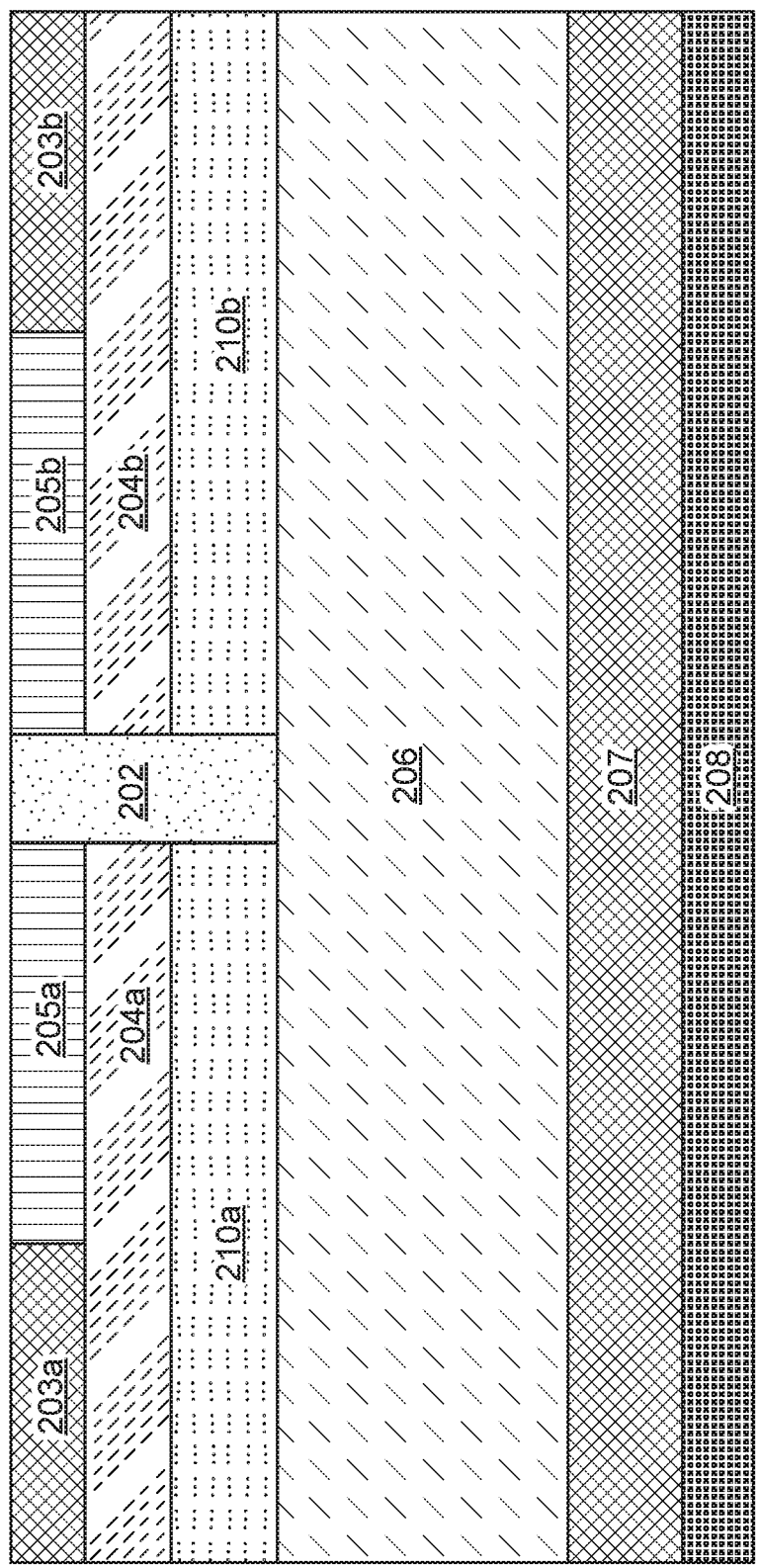
FIG. 23 is a vertical cross section of an example multi-implanted JFET with a vertical channel region between gate and channel regions.

FIG. 23 shows another embodiment, where a vertical channel region 202 is formed between two lateral channel regions 204a and 204b. {INSERT Commentary on this embodiment.}

Figure 24:
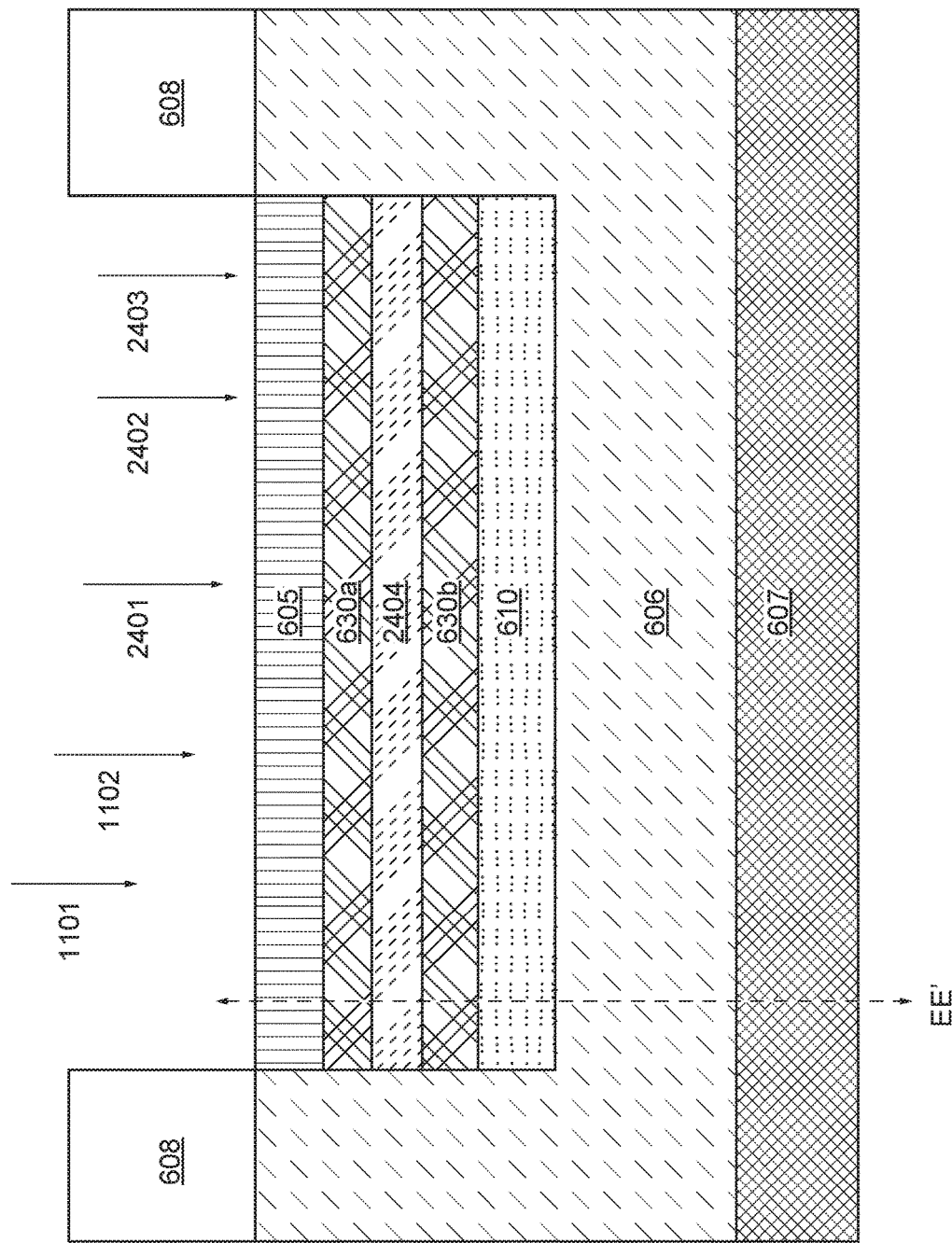
FIG. 24 is a vertical cross section of an example multi-implanted JFET in process with multiple horizontal channel implants.

FIG. 24 shows a portion of an alternative method for making a JFET with multiple channel implants. As described in reference to FIG. 11, a thick patterned mask 608 capable of blocking all the subsequent implants is formed on the surface. Several implants, 1101, 1102, 2401, and 2402 are applied and affect the unmasked areas of the drift 606. Top gate region 605 is created with a low energy implant 1101 of the second doping type. Bottom gate region 610 is created with a high energy implant 1102 of the second doping type. With the same mask, multiple channel implants 2401 and 2402, for example, may be performed to create a layered channel region that includes horizontal channel regions 630a, 630b, and 2404, where the doping concentration of horizontal channel region 2404 may be different from that of horizontal channel region 612. In practice, any number of channel layers may be created, e.g., by using implants of various types and concentrations.

After implantation of the gate and channel layers, mask 608 may be removed and the device completed, e.g., using the methods described in reference to FIGS. 12 to 18. The resulting device will have structures similar to those described in connection with FIGS. 2 to 9, plus one or more additional horizontal channel regions, as illustrated in the example of FIG. 24.

Figure 25:
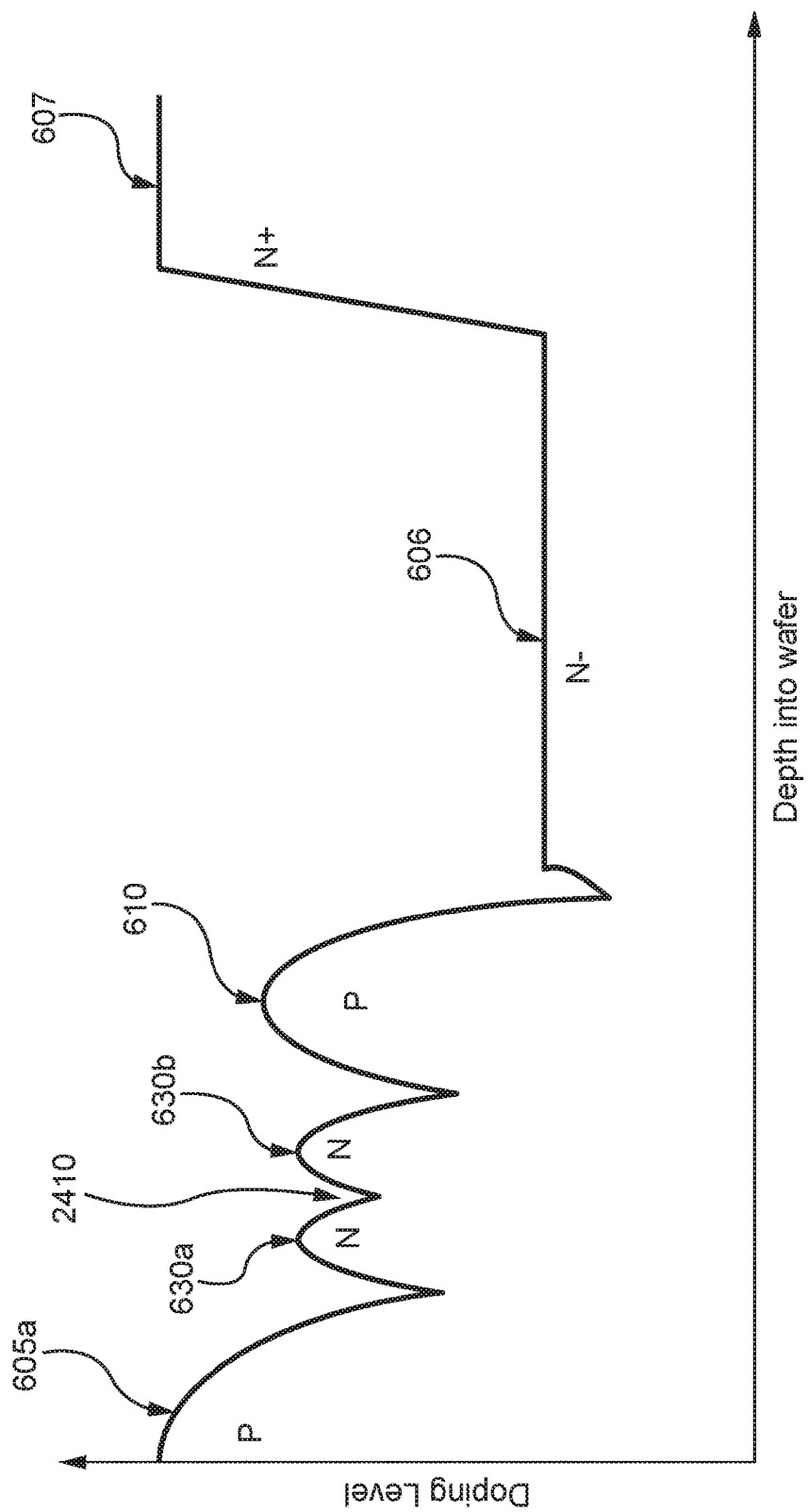
FIG. 25 is a doping profile graph of the multi-implanted JFET of FIG. 24.

FIG. 25 shows an example doping profile for an example multi-implanted re-channel JFET constructed as shown in FIG. 24. The profile of FIG. 25 corresponds to cross section EE' of FIG. 24. Referring now to FIG. 25, at the right is the N+ doping of the substrate drain region 607. To the left of this is the N− doping of the drift region 606. At the left of FIG. 3 are the doping profiles of regions that may be implanted into the drift region 606 using a common hard mask. At the far left, corresponding to the top of the device, is a top gate 605. Below the top gate 605, moving from left to right on the graph of FIG. 25, is a first channel region 604, then a second channel region 630, and then a bottom gate 610. The top gate 605 junction depth is quite shallow, and doped enough to not deplete fully when the device is operated at its negative maximum gate-source voltage. The top gate 605 doping is light enough to be easily compensated by the source contact implant which is of the opposite polarity type. The channel implants 604a and 630 have a peak doping lower than the top gate 605, and are disposed deeper than top gate 605. The bottom gate region 610 is formed by the highest energy implant to position it below the channel implant. Again, the charge in this region must be at least sufficient for this region to not be fully depleted when the device is operating in drain to source breakdown with maximum reverse gate-source voltage. On the other hand, this doping level is preferably not made too high, in order to minimize implant damage that could affect carrier mobility in the channel region 604.

Figure 26:
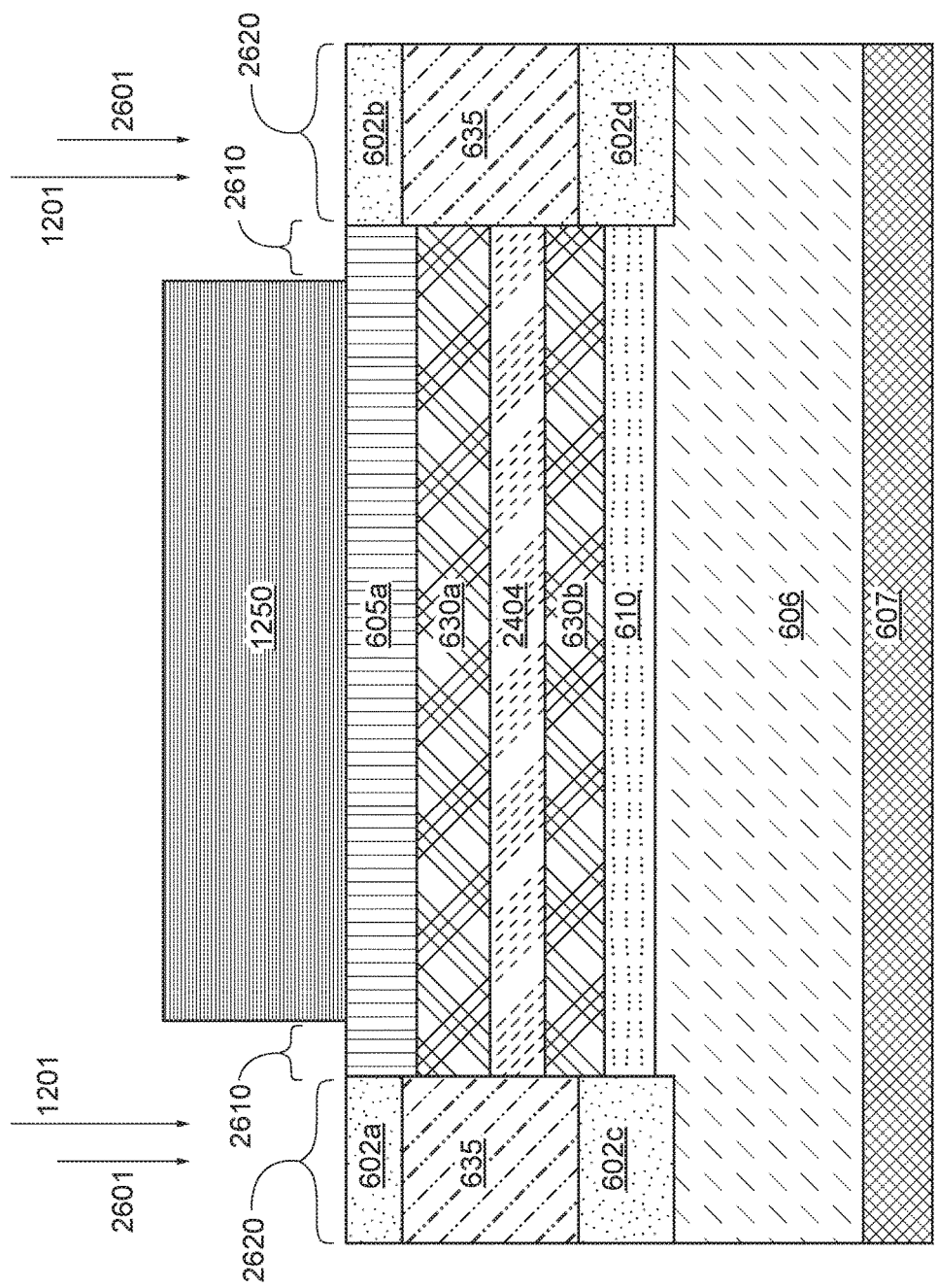
FIG. 26 is a vertical cross section of an example multi-implanted JFET in process with multiple horizontal channel implants and multiple vertical channel implants.

FIG. 26 illustrates a method of creating a device with multiple horizontal channel implants and multiple vertical channel implants. The device in FIG. 26 may be created from the device shown FIG. 24, having a top gate 605a, bottom gate 610, and horizontal channel regions 630a, 630b, and 2404 on a drift region 606 a top a substrate 607. Here in FIG. 26, a mask 1250 is set in place over most of the gate region, with insets 2610. Vertical channel implants 1201 and 2601 are applied at various energies to create vertical channel structures 602a, 602b, 602c, 602d, and 635. The implantation of vertical channel region 635 may result in a different doping concentration from that of vertical channel structures 602a, 602b, 602c, 602d. For example, implant 1201 may be used to set a baseline concentration level for all of the vertical channel regions, and implant 2601 may be used to alter the concentration level within the vertical channel regions portions 635 in proximity to one or more of the horizontal channel regions 630a, 630b, and 2404. Alternatively, implant 2601 may be used to achieve consistent doping of the vertical channel regions, despite, e.g., effects of scattering of the implants of the horizontal channel regions. Similarly, implants such as 1201 and 2601 may be applied in the inset areas 2601, in addition to the primary vertical channel regions 2620, to help assure the proper profile of doping transitions between the horizontal and vertical channel regions.

Alternatively, vertical channel regions of varied doping concentrations may be formed, in part, via angled implantation through the mask window that is used for vertical implantation of the top gate, horizontal channel region or regions, and bottom gate.

Figure 27:
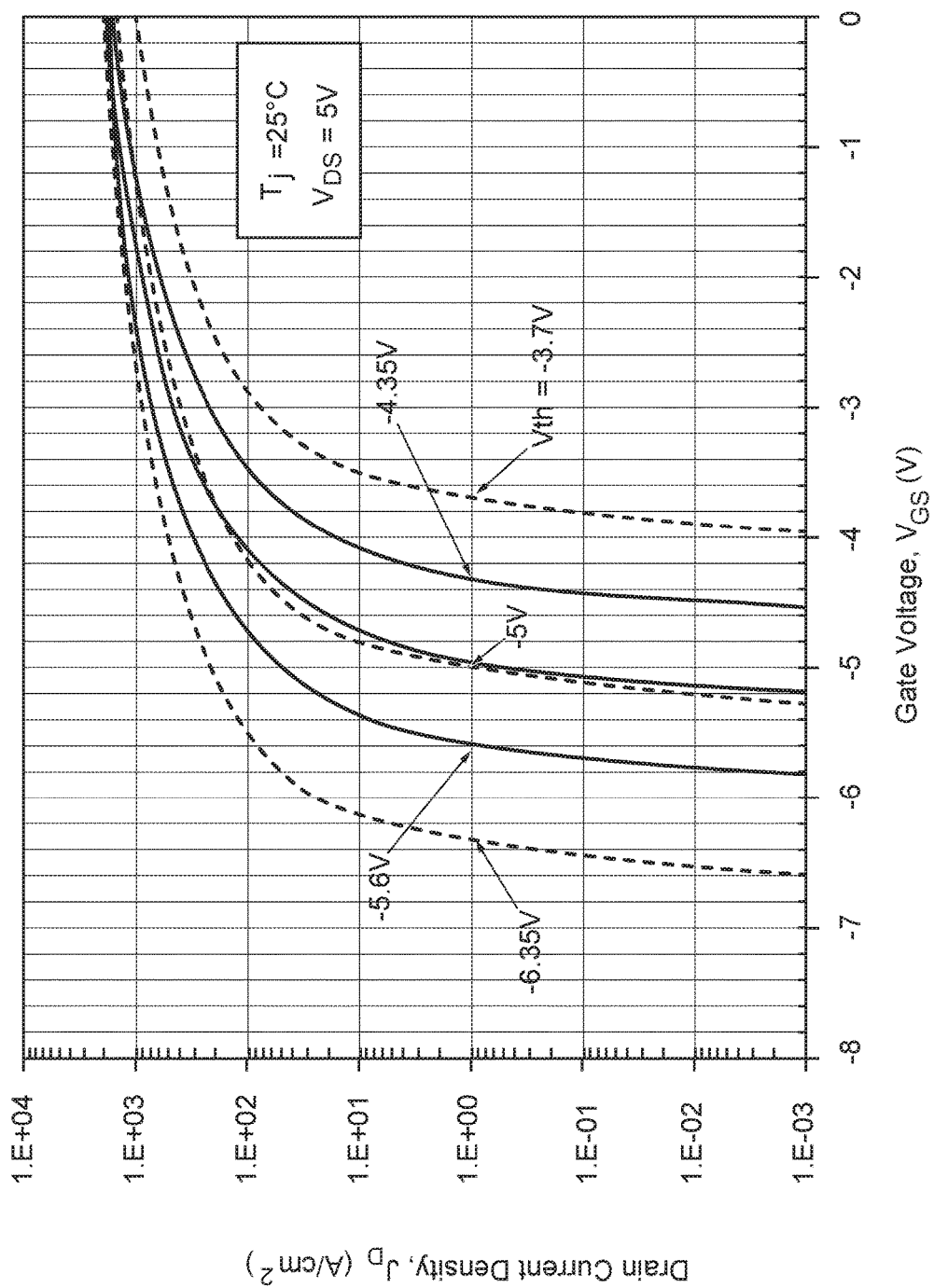
FIG. 27 is a graph of example simulation results comparing control of device threshold voltage for different JFET designs.

FIG. 27 is a graph of simulation results comparing control of device threshold voltage with the multi-implanted aligned lateral channel and gate described herein, as compared to vertical trench epitaxy-based designs. In this example, +/−15% variation in epitaxial doping is assumed, along with +/−5% variation in implanted doping. In practice, the difference between the two may be more dramatic, with +/−25% variation in epitaxial doping compared to only +/−3% or less variation in implanted doping. The curves drawn as solid lines represent simulation results for the implanted planar design. The curves drawn as dashed lines represent simulation results of traditional vertical designs design, such as the design of FIG. 1. For a junction temperature Tj of 25 degrees C., and a drain to source voltage of 5V, at a drain current density of 1E0, both devices are designed to exhibit a threshold of −5V. With process variation, the threshold of the vertical device varies from −6.35V to −3.7V, whereas the threshold of the multiple implanted planar device only varies from −5.6V to −4.35V, or about half as much.

Figure 28:
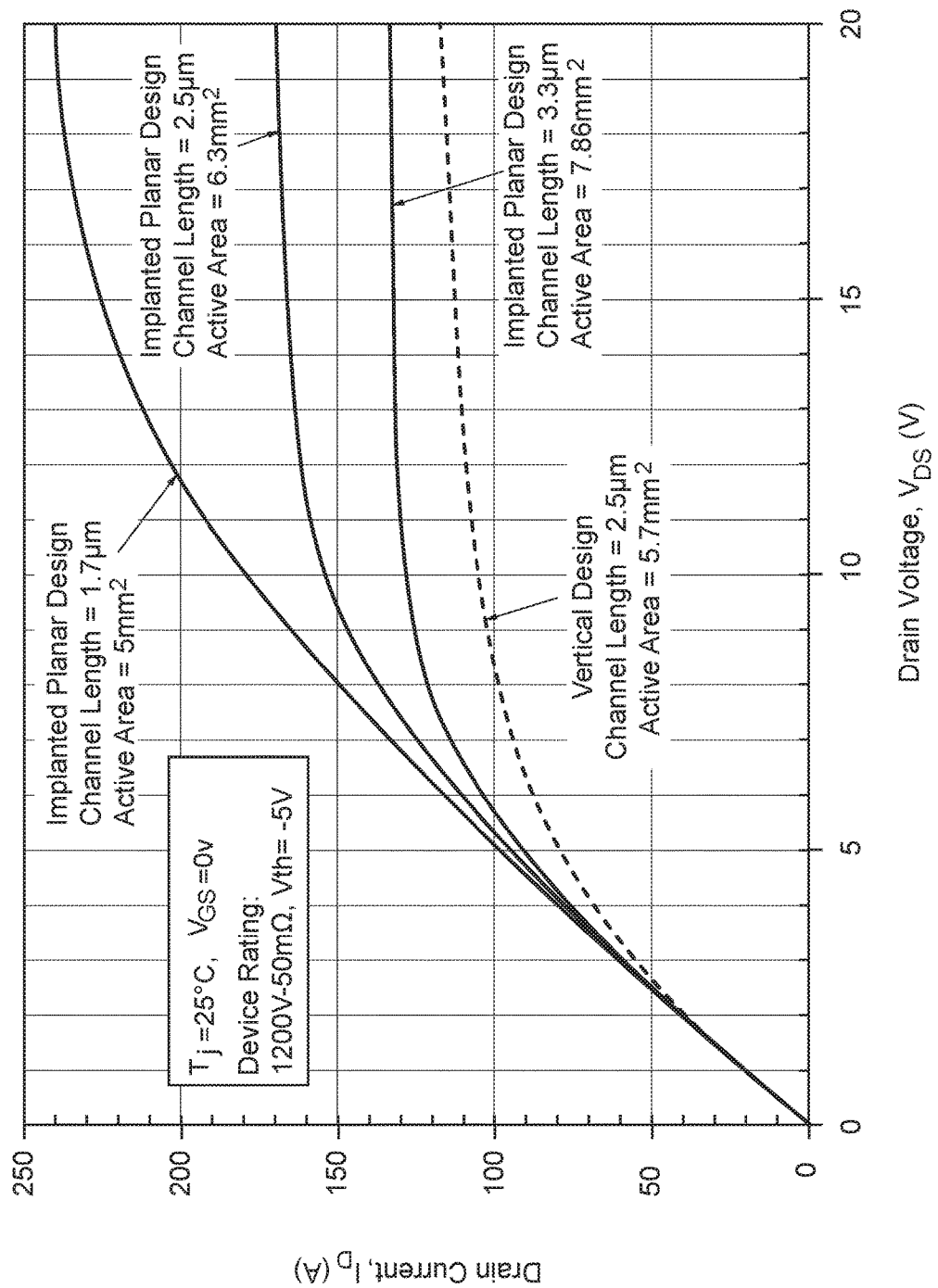
FIG. 28 is a graph of example simulation results for drain current for VGS varying from 0 to 20V.
Figure 29:
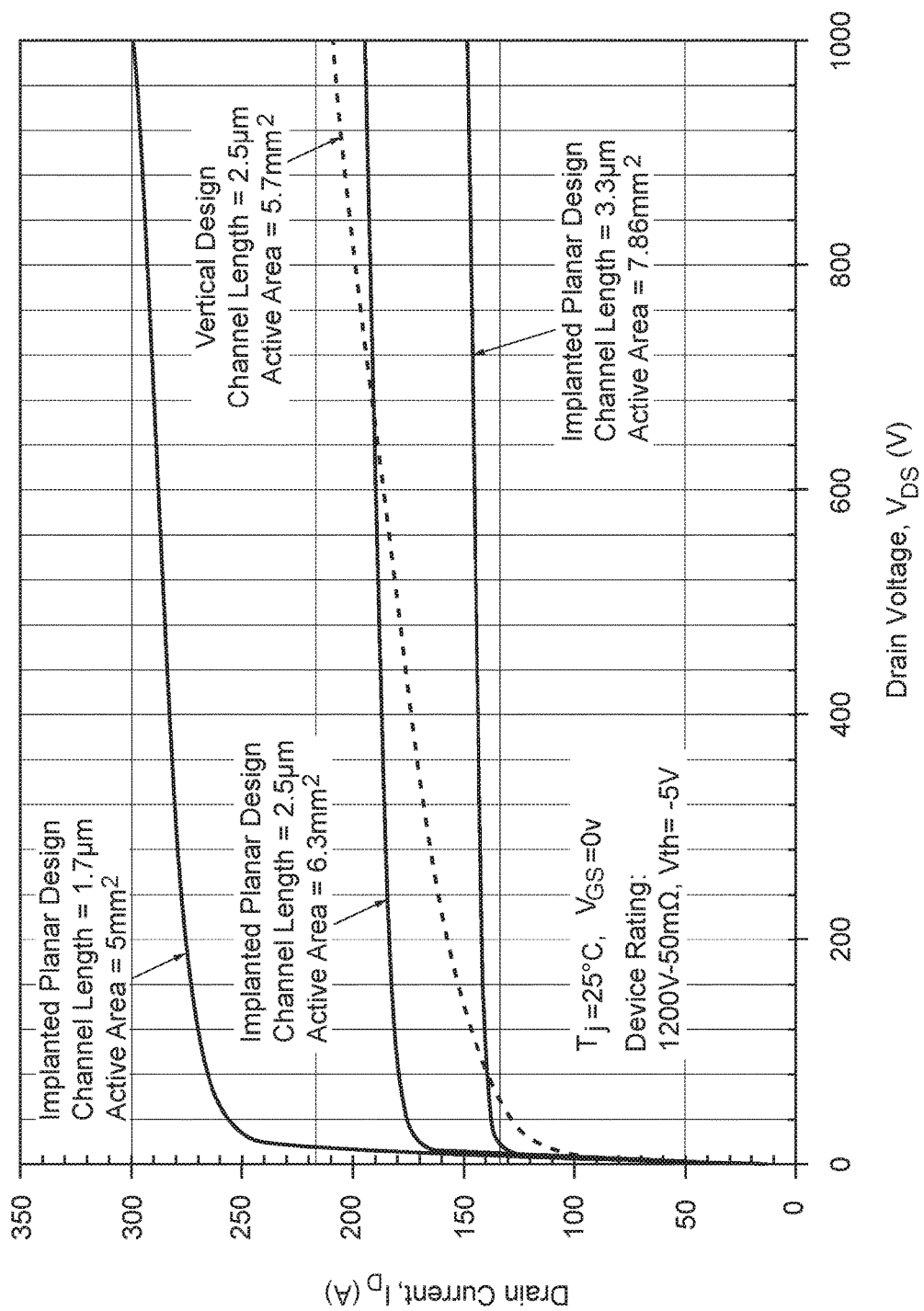
FIG. 29 is a graph of example simulation results for drain current for VGS varying from 0 to 1000V.

FIGS. 28 and 29 are graphs of simulation results for multiple implanted planar devices and a traditional vertical device, showing saturation current versus drain voltage. In contrast to what is seen in traditional VJFET designs, the multiple implant planar design allows the saturation to be controlled by varying the lateral channel length with a simple mask adjustment. No process changes are required to achieve the different saturation levels. FIG. 28 compares three multiple implant planar JFETs to a traditional VJFET for a VGS varying from 0 to 20V. Over higher voltage devices, the effect is more dramatic. FIG. 29 compares the three multiple implant planar JFETs to the traditional VJFET over a VGS range of 0 to 1,000 V. The flatness of the saturation curves for the designs of the present application is a significant advantage, as is the ability to set the saturation at a particular level.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A silicon carbide junction field effect transistor (JFET), comprising:
   a. a drift region atop a drain;
   b. atop the drift region, a top gate, a horizontal channel, and a bottom gate, where the top gate, horizontal channel, and bottom gate are vertically aligned and of the same outer size and outer shape in plan view;
   c. a source, the source extending through a portion of the top gate to the horizontal channel; and
   d. a vertical channel abutting the top gate, the horizontal channel, the bottom gate, and drift region.

2. The silicon carbide JFET of claim 1, wherein: a first, second, and third doping concentration of the drain, the vertical channel, and the horizontal channel respectively are selected such that the threshold voltage of the JFET is set by the horizontal channel region.

3. The silicon carbide JFET of claim 1, such that: when activated by the top gate and bottom gate, current flows from the source into the horizontal channel and then into the vertical channel, drift region, and the drain.

4. The silicon carbide JFET of claim 1, wherein: the horizontal channel comprises two or more horizontal channel regions, the horizontal channel regions being of a first doping type, where a first horizontal channel region has a first doping concentration and a second horizontal channel region has a second doping concentration.

5. The silicon carbide JFET of claim 4, wherein: the horizontal channel comprises the first horizontal channel region, the second horizontal channel region, and a third horizontal channel region, where the third horizontal channel region has a third doping concentration level, where the third doping concentration is the same as the first doping concentration.

6. The silicon carbide JFET of claim 4, wherein: the vertical channel comprises two or more vertical channel regions, the vertical channel regions being of the first doping type, where a first vertical channel region has a third doping concentration and a second vertical channel region has a fourth doping concentration.

7. The silicon carbide JFET of claim 1, wherein: the vertical channel comprises two or more vertical channel regions, the vertical channel regions being of a first doping type, where a first vertical channel region has a first doping concentration and a second vertical channel region has a second doping concentration.

8. The silicon carbide JFET of claim 7, wherein: the vertical channel comprises the first vertical channel region, the second vertical channel region, and a third vertical channel region, where the third vertical channel region has a third doping concentration level, where the third doping concentration is the same as the first doping concentration.

9. A silicon carbide JFET of claim 1, further comprising: a ring of material around the source, between the source and the top gate, where the ring of material has a doping concentration that is ten percent or less of the doping concentration of the source.

10. The silicon carbide JFET of claim 1, wherein: the top gate abuts the source.

* * * * *

UNITED STATES PATENT AND TRADEMARK OFFICE
CERTIFICATE OF CORRECTION

PATENT NO. : 10,446,695 B2
APPLICATION NO. : 15/482139
DATED : October 15, 2019
INVENTOR(S) : Anup Bhalla et al.

Page 1 of 1

It is certified that error appears in the above-identified patent and that said Letters Patent is hereby corrected as shown below:

On the Title Page

(73) Assignee: Please delete "United Silicone Carbide, Inc." and replace with -- United Silicon Carbide, Inc. --.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*